United States Patent
Kim et al.

(10) Patent No.: US 9,478,680 B2
(45) Date of Patent: Oct. 25, 2016

(54) SOLAR CELL AND METHOD FOR MANUFACTURING THE SAME, AND SOLAR CELL MODULE

(71) Applicant: LG ELECTRONICS INC., Seoul (KR)

(72) Inventors: Jinah Kim, Seoul (KR); Jonghwan Kim, Seoul (KR); Younghyun Lee, Seoul (KR); Ilhyoung Jung, Seoul (KR); Seongeun Lee, Seoul (KR); Jeongbeom Nam, Seoul (KR); Minho Choi, Seoul (KR); Sungjin Kim, Seoul (KR); Juhwan Yun, Seoul (KR)

(73) Assignee: LG ELECTRONICS INC., Seoul (KR)

(*) Notice: Subject to any disclaimer, the term of this patent is extended or adjusted under 35 U.S.C. 154(b) by 0 days.

(21) Appl. No.: 14/733,041

(22) Filed: Jun. 8, 2015

(65) Prior Publication Data

US 2015/0270420 A1  Sep. 24, 2015

Related U.S. Application Data

(63) Continuation of application No. 13/472,151, filed on May 15, 2012, now Pat. No. 9,070,798, which is a continuation of application No. 12/715,886, filed on Mar. 2, 2010, now abandoned.

(30) Foreign Application Priority Data

Mar. 3, 2009 (KR) .................. 10-2009-0017946
Jun. 9, 2009 (KR) .................. 10-2009-0051087

(51) Int. Cl.
*H01L 31/00* (2006.01)
*H01L 31/0224* (2006.01)
*H01L 31/068* (2012.01)

(52) U.S. Cl.
CPC ......... *H01L 31/022433* (2013.01); *H01L 31/022425* (2013.01); *H01L 31/068* (2013.01); *Y02E 10/547* (2013.01)

(58) Field of Classification Search
CPC ............ H01L 31/022425; H01L 31/022433
See application file for complete search history.

(56) References Cited

U.S. PATENT DOCUMENTS 4,301,322 A   11/1981  Amick
4,487,989 A   12/1984  Wakefield et al.
(Continued)

FOREIGN PATENT DOCUMENTS

JP   06151907 A       5/1994
JP   EP 1936699 A1 *  6/2008  ..... H01L 31/022433
(Continued)

*Primary Examiner* — Eli Mekhlin
(74) *Attorney, Agent, or Firm* — Birch, Stewart, Kolasch & Birch, LLP

(57) ABSTRACT

A solar cell can include a substrate of a first conductive type; an emitter layer of a second conductive type opposite the first conductive type, and positioned on the substrate; a plurality of finger electrodes formed in a first direction, each finger electrode being electrically connected to the emitter layer; a plurality of first collector regions; a plurality of first electrodes positioned in a plurality of first collector regions and extending in the first direction from the plurality of finger electrodes; a plurality of second electrodes positioned in the plurality of first collector regions and formed in a perpendicular direction crossing the first direction; a plurality of third electrodes positioned in the plurality of first collector regions, connecting two neighboring first electrodes of the plurality of first electrodes and formed in the perpendicular direction; and a plurality of deletions positioned in the plurality of first collector regions. Furthermore, one of the plurality of second electrodes is positioned between a pair of the plurality of first electrodes.

11 Claims, 40 Drawing Sheets

(56) References Cited

U.S. PATENT DOCUMENTS

| | | |
|---|---|---|
| 5,034,068 A | 7/1991 | Glenn et al. |
| 6,147,297 A | 11/2000 | Wettling et al. |
| 2007/0095387 A1 | 5/2007 | Fujii et al. |
| 2007/0199591 A1 | 8/2007 | Harder et al. |
| 2007/0295399 A1 | 12/2007 | Carlson |
| 2008/0041436 A1* | 2/2008 | Lau ................... H01L 31/02242 136/244 |
| 2008/0121265 A1 | 5/2008 | Hishida et al. |

FOREIGN PATENT DOCUMENTS

| | | |
|---|---|---|
| JP | 2008-159789 A | 7/2008 |
| KR | 10-2004-0042209 A | 5/2004 |
| WO | WO 2009/099179 A1 | 8/2009 |

* cited by examiner

FIG. 35
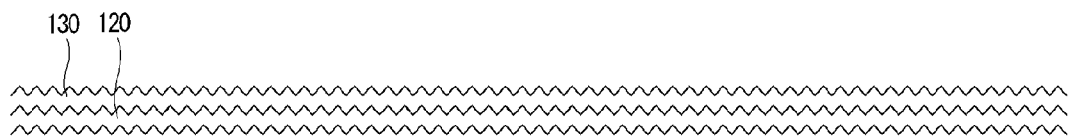
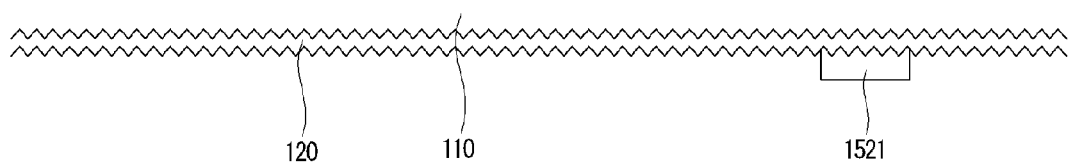
FIG. 36
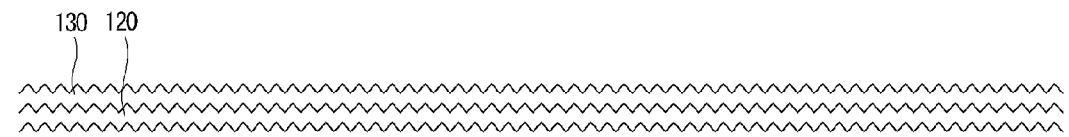
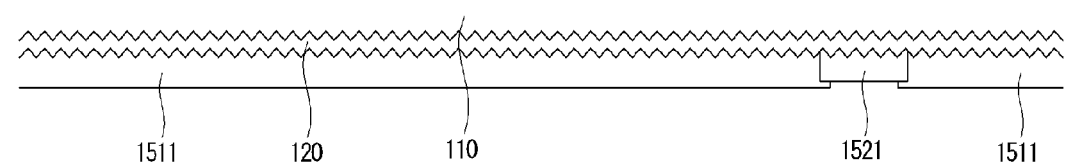

SOLAR CELL AND METHOD FOR MANUFACTURING THE SAME, AND SOLAR CELL MODULE

CROSS-REFERENCE TO RELATED APPLICATIONS

This application is a continuation of U.S. patent application Ser. No. 13/472,151, filed on May 15, 2012, now U.S. Pat. No. 9,070,798, issued Jun. 30, 2015, which is a continuation of U.S. patent application Ser. No. 12/715,886 filed on Mar. 2, 2010, which claims priority to and the benefit of Korean Patent Application No. 10-2009-0017946 and 10-2009-0051087 filed in the Korean Intellectual Property Office on Mar. 3, 2009 and Jun. 9, 2009, respectively, and the contents of all of the above are incorporated herein by reference.

BACKGROUND OF THE INVENTION

1. Field of the Invention

Embodiments relates to a solar cell and a method for manufacturing the same, and a solar cell module.

2. Discussion of the Related Art

Recently, as existing energy sources such as petroleum and coal are expected to be depleted, interests in alternative energy sources for replacing the existing energy sources are increasing. Among the alternative energy sources, solar cells have been particularly spotlighted because, as cells for generating electric energy from solar energy, the solar cells are able to draw energy from an abundant source and do not cause environmental pollution.

A typical solar cell includes a substrate and an emitter layer formed of a semiconductor, each having a different conductive type such as a p-type and an n-type, and electrodes respectively formed on the substrate and the emitter layer. The typical solar cell also includes a p-n junction formed at an interface between the substrate and the emitter layer.

When light is incident on the solar cell, a plurality of electron-hole pairs are generated in the semiconductor. Each of the electron-hole pairs is separated into electrons and holes by the photovoltaic effect. Thus, the separated electrons move to the n-type semiconductor (e.g., the emitter layer) and the separated holes move to the p-type semiconductor (e.g., the substrate), and then the electrons and holes are collected by the electrodes electrically connected to the emitter layer and the substrate, respectively. The electrodes are connected to each other using electric wires to thereby obtain an electric power.

SUMMARY OF THE INVENTION

According to an aspect of the present invention, a charge transferor of a solar cell, which collects and transfer charges generated from a semiconductor substrate, may include at least one electrode collecting the charges; and at least one collector region transferring the charges collected by the at least one electrode, wherein an area formed by linearly connecting both lateral sides of the at least one collector region in a first direction includes at least one deletion.

The at least one electrode may include a plurality of electrodes, and the at least one collector region includes a plurality of collectors positioned between each of pairs of electrodes and connected to the pairs of electrodes.

The at least one collector region may further include at least one connecting region positioned between two neighboring collectors and connected to the neighboring collectors.

A horizontal width of the connecting region and a horizontal width of the collectors may be different from each other.

At least one of both lateral sides of the at least one collector region may include a corrugated portion.

The corrugated portion may have a triangular saw-toothed shape.

The corrugated portion may have a rectangular saw-toothed shape.

The plurality of collector regions may have the same shape.

The at least one collector region may further include at least one metal film extending in the first direction on the plurality of collectors.

A width of the at least one metal film may be greater than or equal to a width of the plurality of collectors.

The at least one electrodes may include a plurality of point contacts positioned on the semiconductor substrate to be spaced apart from each other so as to collect the charges.

The at least one electrodes may further include a metal film positioned on the plurality of point contacts along the plurality of point contacts.

The metal film may be made of a transparent conductive material.

According to another aspect of the present invention, a charge transferor of a solar cell, which collects and transfer charges generated from a semiconductor substrate, may include at least one electrode collecting the charges; and at least one collector region transferring the charges collected by the at least one electrode, wherein the at least one electrodes include a plurality of contact points positioned on the semiconductor substrate to be spaced apart from each other so as to collect the charges.

The at least one electrodes may further include a metal film positioned on the plurality of point contacts along the plurality of point contacts.

The metal film may be made of a transparent conductive material.

According to another aspect of the present invention, a solar cell may include a substrate of a first conductive type; an emitter layer of a second conductive type, which is opposite to the first conductive type, positioned on the substrate; a plurality of first electrodes electrically connected to the emitter layer; at least one collector region connected to the plurality of first electrodes; a second electrode electrically connected to the substrate; and at least one second collector region connected to the second electrode, wherein an area formed by linearly connecting in a first direction both lateral sides of at least one of the at least one first collector region and the at least one second collector region includes at least one deletion.

At least one of the at least one collector region and the at least one second collector region may include a plurality of collectors connected to the plurality of first electrodes or the second electrode.

At least one of the at least one collector region and the at least one second collector region may include at least one connecting region positioned between two neighboring collectors and connected to the neighboring collectors.

At least one of the at least one collector region and the at least one second collector region may include a portion corrugated on at least one of both lateral sides.

The corrugated portion may have a triangular saw-toothed shape.

The corrugated portion may have a rectangular saw-toothed shape.

The at least one first collector region may include the plurality of collectors, and the plurality of collectors may be positioned between each of pairs of the first electrodes.

At least one of the at least one first collector region and the second collector region may further include at least one metal film extending in the first direction on the plurality of collectors.

Each of the plurality of first electrodes may include a plurality of conductors which extend in a second direction different from the first direction to be spaced apart from one each and is positioned to be electrically connected to the emitter layer.

Each of the plurality of first electrodes may further include a metal film positioned on the plurality of conductors along the plurality of conductors.

The metal film may be made of a transparent conductive material.

According to another aspect of the present invention, a solar cell may include a substrate of a first conductive type; an emitter layer of a second conductive type, which is opposite to the first conductive type, positioned on the substrate; a plurality of first electrodes electrically connected to the emitter layer; at least one collector region connected to the plurality of first electrodes; a second electrode electrically connected to the substrate; and at least one second collector region connected to the second electrode, wherein each of the plurality of first electrodes includes a plurality of point contacts spaced apart from one another and electrically connected to the emitter layer.

Each of the plurality of first electrodes may further include a metal film positioned on the plurality of point contacts and contacting the plurality of point contacts.

The metal film may be made of a transparent conductive material.

According to another aspect of the present invention, a method for manufacturing a solar cell may include forming an emitter layer of a second conductive type on a substrate of a first conductive type, the second conductive type being opposite to the first conductive type; applying a first paste on a first surface of the substrate to form a plurality of point contact patterns; forming a second paste on a second surface of the substrate positioned on the opposite side of the first surface to form a first electrode pattern; thermally treating the substrate provided with the plurality of first point contact patterns and the first electrode pattern at a first temperature to form a plurality of point contacts connected to the emitter layer and a first electrode electrically connected to the substrate; forming a first metal film pattern extending in a first direction on exposed parts of the emitter layer of the first surface; and thermally treating the substrate provided with the first metal film pattern at a second temperature to form a plurality of first metal films electrically connected to the plurality of point contacts and extending in the first direction.

The first temperature may be higher than the second temperature.

In the forming of the metal film pattern, when the first metal film pattern is formed, a second metal film pattern may be formed positioned on the plurality of point contacts and extending in a second direction different from that of the first metal film pattern, and in the forming of the plurality of first metal films, the second metal film pattern may be thermally treated along with the first metal film pattern to further form a plurality of second metal films extending in the second direction different from that of the first metal film.

The first and second metal film patterns may contain a transparent conductive material.

According to another aspect of the present invention, a solar cell module may include a plurality of solar cells, each solar cell including an emitter layer positioned on a substrate and having a conductive type opposite to that of the substrate, a plurality of first electrodes electrically connected to the emitter layer, at least one collector region connected to the plurality of first electrodes, a second electrode electrically connected to the substrate, and at least one second collector region electrically connected to the second electrode; and at least one conductive connecting portion positioned on the first collector region and the second collector region respectively positioned at neighboring solar cells among the plurality of solar cells, and electrically connecting the first collector region and the second collector region, wherein an area formed by linearly connecting in a first direction both lateral sides of at least one of the first collector region and the second collector region includes at least one deletion.

Each of the plurality of first electrodes may include a plurality of conductors which discontinuously extend in a second direction different from the first direction to be spaced apart from one another and are positioned to be electrically connected to the emitter layer.

Each of the plurality of first electrodes may further include a metal film positioned on the plurality of conductors along the plurality of conductors.

According to another aspect of the present invention, a solar cell module may include a plurality of solar cells, each solar cell including an emitter layer positioned on a substrate and having a conductive type opposite to that of the substrate, a plurality of first electrodes electrically connected to the emitter layer, at least one collector region connected to the plurality of first electrodes, a second electrode electrically connected to the substrate, and at least one second collector region electrically connected to the second electrode; and at least one conductive connecting portion positioned on the first collector region and the second collector region respectively positioned at neighboring solar cells among the plurality of solar cells, and electrically connecting the first collector region and the second collector region, wherein each of the plurality of first electrodes includes a plurality of point contacts spaced apart from one another and electrically connected to the emitter region.

Each of the plurality of first electrodes may further include a metal film positioned on the plurality of point contacts and contacting the plurality of point contacts.

The metal film may be made of a transparent conductive material.

According to another aspect of the present invention, a charge transferor of a solar ell, which collects and transfer charges generated from a semiconductor substrate, includes a plurality of electrodes which collects the charges and are disposed generally in a first direction; and at least one collector which transfers the charges collected by the plurality of electrodes, the at least one collector being included in at least one collector region disposed on the semiconductor substrate and extending generally in a second direction that crosses the first direction, wherein the at least one collector region further includes at least one deletion portion where a portion of the at least one collector is not formed.

According to another aspect of the present invention, a charge transferor of a solar cell, which collects and transfer charges generated from a semiconductor substrate, includes at least one electrode to collect the charges; and at least one collector to transfer the charges collected by the at least one electrode, wherein the at least one electrode includes a plurality of contact points positioned on the semiconductor substrate to be spaced apart from each other so as to collect the charges.

According to another aspect of the present invention, a solar cell includes a substrate of a first conductive type; an emitter layer of a second conductive type, which is opposite to the first conductive type, and positioned on the substrate; a plurality of first electrodes electrically connected to the emitter layer; at least one first collector connected to the plurality of first electrodes, the at least one first collector being included in at least one first collector region on the substrate; a second electrode electrically connected to the substrate; and at least one second collector connected to the second electrode, the at least one second collector being included in at least one second collector region on the substrate, wherein at least one of the at least one first collector region and the at least one second collector region includes at least one deletion portion where the at least one first collector or the at least one second collector is not formed.

According to another aspect of the present invention, a solar cell includes a substrate of a first conductive type; an emitter layer of a second conductive type, which is opposite to the first conductive type, and positioned on the substrate; a plurality of first electrodes electrically connected to the emitter layer; at least one first collector connected to the plurality of first electrodes; a second electrode electrically connected to the substrate; and at least one second collector connected to the second electrode, wherein the plurality of first electrodes is a plurality of point contacts spaced apart from one another and electrically connected to the emitter layer.

According to another aspect of the present invention, a method for manufacturing a solar cell includes forming an emitter layer of a second conductive type on a substrate of a first conductive type, the second conductive type being opposite to the first conductive type; applying a first paste on a first surface of the substrate to form a plurality of point contact patterns; forming a second paste on a second surface of the substrate positioned on the opposite side of the first surface to form a first electrode pattern; thermally treating the substrate provided with the plurality of point contact patterns and the first electrode pattern at a first temperature to form a plurality of point contacts connected to the emitter layer and a first electrode electrically connected to the substrate; forming a first metal film pattern extending in a first direction on exposed parts of the emitter layer of the first surface; and thermally treating the substrate provided with the first metal film pattern at a second temperature to form a plurality of first metal films electrically connected to the plurality of point contacts and extending in the first direction.

According to another aspect of the present invention, a solar cell, module includes a plurality of solar cells, each solar cell including an emitter layer positioned on a substrate and having a conductive type opposite to that of the substrate, a plurality of first electrodes electrically connected to the emitter layer, at least one first collector connected to the plurality of first electrodes, the at least one first collector being included in at least one first collector region on the substrate, a second electrode electrically connected to the substrate, and at least one second collector electrically connected to the second electrode, the at least one second collector being included in at least one second collector region on the substrate; and at least one conductive connecting portion positioned on the at least one first collector region and the at least one second collector region respectively positioned at neighboring solar cells among the plurality of solar cells, and electrically connecting the at least one first collector region and the at least one second collector region, wherein of at least one of the first collector region and the second collector region includes at least one deletion portion where the at least one first collector or the at least one second collector is not formed.

According to another aspect of the present invention, a solar cell module includes a plurality of solar cells, each solar cell including an emitter layer positioned on a substrate and having a conductive type opposite to that of the substrate, a plurality of first electrodes electrically connected to the emitter layer, at least one first collector connected to the plurality of first electrodes, the at least one first collector being included in at least one first collector region on the substrate, a second electrode electrically connected to the substrate, and at least one second collector electrically connected to the second electrode, the at least one second collector being included in at least one second collector region on the substrate; and at least one conductive connecting portion positioned on the at least one first collector region and the at least one second collector region respectively positioned at neighboring solar cells among the plurality of solar cells, and electrically connecting the at least one first collector region and the at least one second collector region, wherein the plurality of first electrodes is a plurality of point contacts spaced apart from one another and electrically connected to the emitter layer.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIGS. 32 to 39 are cross-sectional views sequentially showing a method for manufacturing a solar cell according to another example embodiment of the present invention;

DETAILED DESCRIPTION OF THE INVENTION

Figure 1:
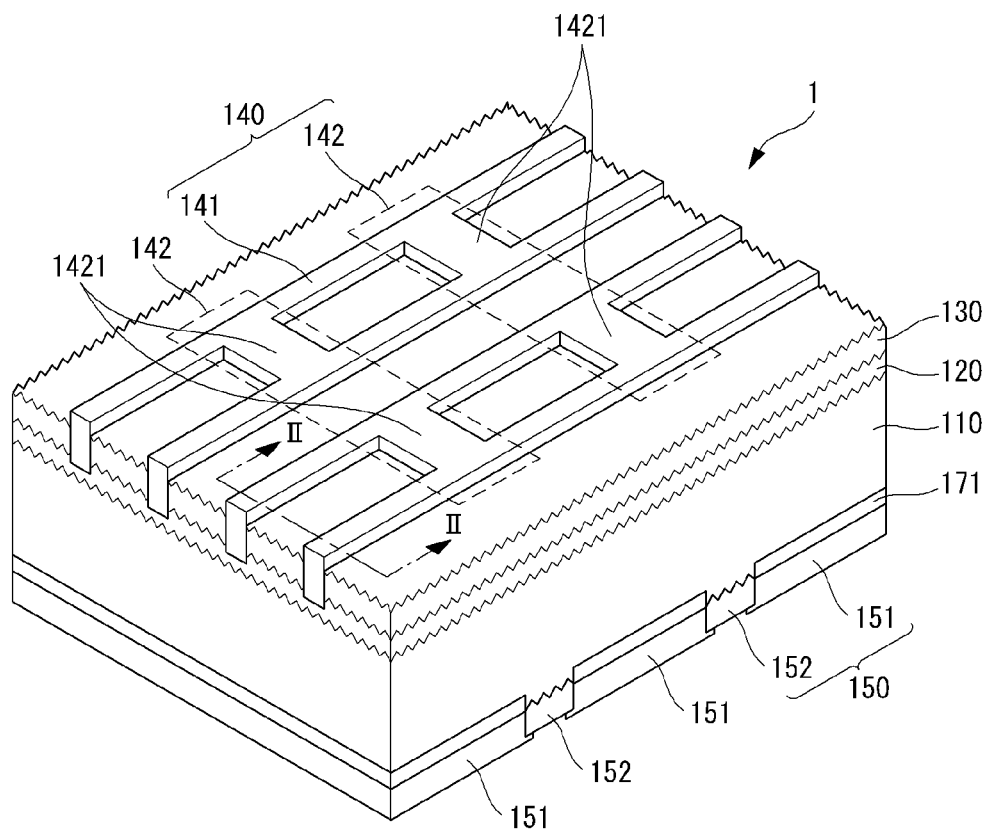
FIG. 1 is a partial perspective view of a solar cell according to an example embodiment of the present invention.

The invention will be described more fully hereinafter with reference to the accompanying drawings, in which example embodiments of the inventions are shown. This invention may, however, be embodied in many different forms and should not be construed as limited to the embodiments set forth herein In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

A solar cell and a method for manufacturing the same and a solar cell module according to example embodiments of the present invention will be described with reference to the accompanying drawings.

First, a solar cell according to example embodiments of the present invention will be described in detail with reference to FIGS. 1 to 3.

FIG. 1 is a partial perspective view of a solar cell according to one example embodiment of the present invention. FIG. 2 is a cross-sectional view of the solar cell, of FIG. 1 taken along line II-II. FIG. 3 is a view showing one example of second collector units of the solar cell shown in FIG. 1.

Figure 2:
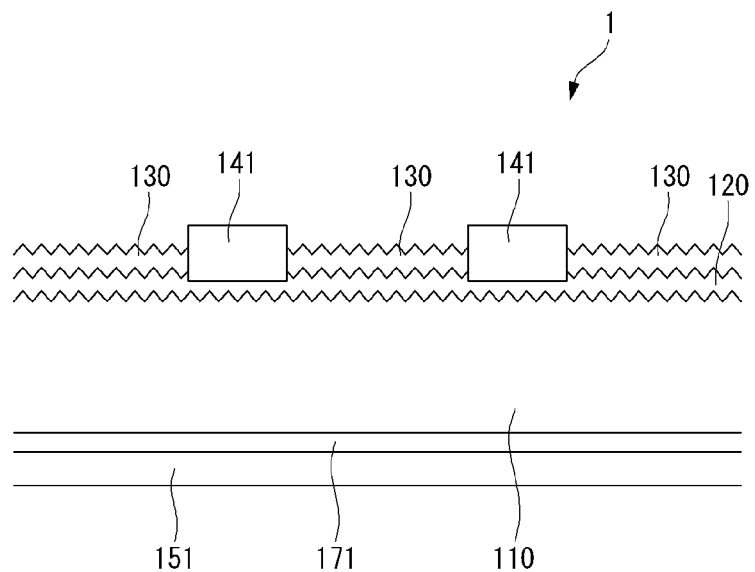
FIG. 2 is a cross-sectional view of the solar cell of FIG. 1 taken along line II-II.

Referring to FIGS. 1 and 2, a solar cell according to one example embodiment of the present invention includes a substrate 110, an emitter layer 120 positioned on the front surface of the substrate 110, which is an incident surface on which light is incident, an anti-reflection layer 130 positioned on the emitter layer 120, a first charge transfer unit (a first charge transferor) 140 electrically connected to the emitter layer 120, a second charge transfer unit (a second charge transferor) 150 positioned on the rear surface of the substrate 110 which is the opposite surface of the incident surface, and a back surface field (BSF) 171 positioned between the substrate 110 and the second charge transfer unit 150.

The substrate 110 is a semiconductor substrate formed of silicon of a first conductive type, for example, a p-conductive type. In the example embodiment, the substrate 110 may be formed of crystalline silicon such as monocrystalline silicon or polycrystalline silicon. However, the substrate 110 may be formed of amorphous silicon. If the substrate 110 is a p-conductive type, it may contain an impurity of a group III element, such as boron (B), gallium (G), and indium (In). Alternatively, however, the substrate 110 may be an n-conductive type, and may be made of a semiconductor material other than silicon. If the substrate 110 is an n-conductive type, the substrate 110 may contain an impurity of a group V element, such as phosphor (P), arsenic (As), and antimony (Sb).

The surface of the substrate 110 is textured to form a textured surface which is an uneven surface or has uneven characteristics.

The emitter layer 120 is an impurity region of a second conductive type, for example, an n-conductive type, which is opposite to the conductive type of the substrate 110. Hence, the substrate 110 and the emitter layer 120 form a p-n junction. If the emitter layer 120 is an n-conductive type, the emitter layer 120 may contain an impurity of a group V element.

Pairs of electrons and holes, which are charges generated by light incident on the substrate 110, are separated into electrons and holes due to a built-in potential difference caused by the p-n junction, and therefore the electrons move toward an n-type semiconductor and the holes move toward a p-type semiconductor. Thus, if the substrate 110 is a p-type and the emitter layer 120 is an n-type, the separated holes move toward the substrate 110 and the separated electrons move toward the emitter layer 120.

Since the emitter layer 120 forms a p-n junction with the substrate 110, if the substrate 110 is an n-conductive type unlike the example embodiment discussed above, the emitter layer 120 is a p-conductive type. In this case, the separated electrons move toward the substrate 110 and the separated holes move toward the emitter layer 120. If the emitter layer 120 is a p-conductive type, the emitter layer 120 may be formed by doping an impurity of a group III element on the substrate 110.

The anti-reflection layer 130 positioned on the emitter layer 120 is formed of a silicon nitride film (SiNx) or a titanium oxide film (TiOx). The anti-reflection layer 130 reduces the reflectance of light incident on the solar cell 1 and increases the selectivity of a specific wavelength band, thereby increasing the efficiency of the solar cell 1. Although the anti-reflection layer 130 has a single layer structure in the shown example embodiment, it may have a multilayered structure, such as a double-layered structure, or may be omitted, if necessary or desired.

As shown in FIGS. 1 and 2, the first charge transfer unit 140 has a plurality of first electrodes 141, and a plurality of first collector regions 142 having a plurality of first collectors 1421.

The plurality of first electrodes 141 extends almost in parallel in a predetermined direction, and collects the charges, for example, electrons that move toward the emitter layer 120.

The plurality of first collector regions 142 and the plurality of first collectors 1421 extend almost in parallel in a direction crossing the plurality of first electrodes 141. The plurality of first collectors 1421 is positioned on the same layer as the plurality of first electrodes 141 and connected to the plurality of first electrodes 141.

The plurality of first collectors 1421 collects the charges transferred from the plurality of first electrodes 141 and outputs the charges to an external device.

The first collector regions 142 will be described later in more detail. In embodiments of the invention, a collector region, such as the first collector region 142, may be defined as follows.

Figure 4:
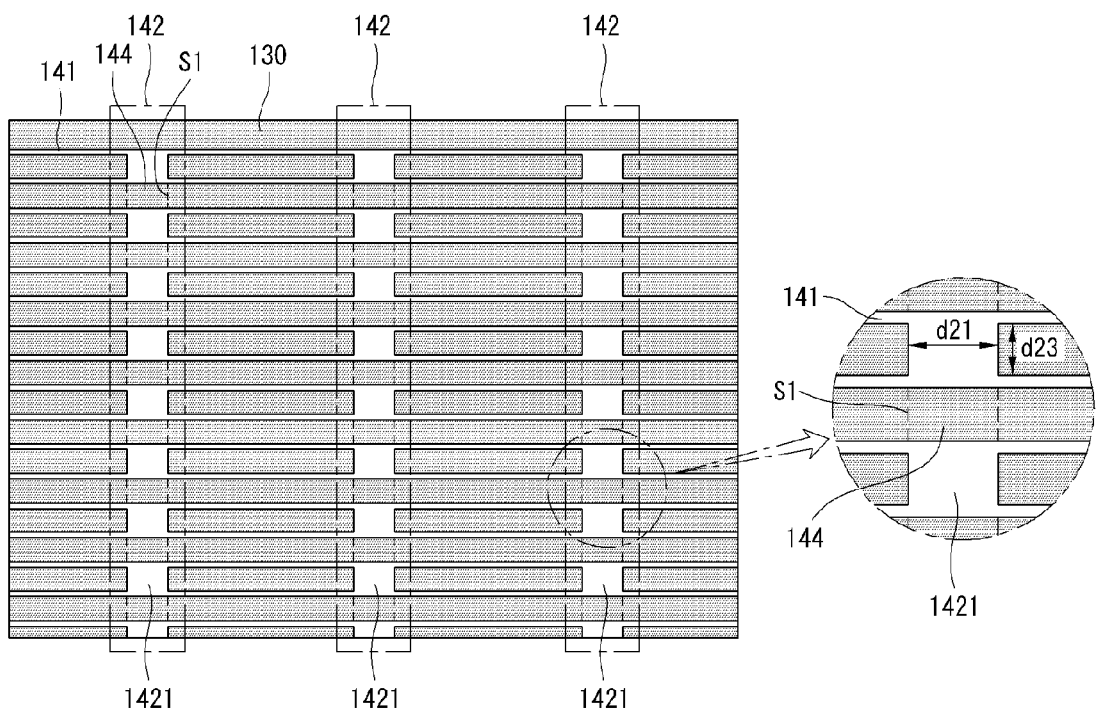
FIGS. 4 to 16 are views showing various examples of the first collector units according to example embodiments of the present invention

When a plurality of electrodes (such as the electrodes 141) includes a first electrode and a second electrode, the at least one collector (such as the first collector 1421) includes a first collector and a second collector, and the at least one collector region (such as the first collector region 142) has an area defined by a width in the first direction and a length in the second direction, then the width of the collector region may include a first point on the first electrode that contacts a first peripheral point of the first collector and a second point on the first electrode that contacts a second peripheral point of the first collector, and the length of the collector region may include the first point on the first electrode that contacts the first peripheral point of the first collector and a first point on the second electrode that contacts a first peripheral point of the second collector. Other ways of defining the collector region is possible. By way of example, as shown in FIG. 4, the area is defined to include a point of the top-most first electrode 141 that contacts a left-most peripheral point of the top-most first collector 1421 and a point on the top-most first electrode 141 that contacts a right-most peripheral point of the same first collector 1421, and the length of the collector region includes the point of the top-most first electrode 141 that contacts the left-most peripheral point of the first collector 1421 and a point on bottom-most first electrode 141 that contacts a left-most peripheral point of the bottom-most first collector 1421. However, the two collectors and the two electrodes used to define the area of the collector region need not be the top and bottom-most collectors and electrodes. Any two pairs of electrodes, and one or more collectors may be used to define the collector region, as will be evident from the drawing figures.

The plurality of first electrodes 141 and the plurality of first collectors 1421 are connected to the emitter layer 120. Hence, the anti-reflection layer 130 is mainly positioned on the emitter layer 120 where the plurality of first electrodes 141 and the plurality of first collectors 1421 are not positioned.

The plurality of front electrodes 141 and the plurality of first collectors 1421 contain a conductive material, such as silver (Ag). However, they may contain, instead of silver (kg), at least one selected from the group consisting of nickel (Ni), copper (Cu), aluminum (Al), tin (Sn), zinc (Zn), indium (In), titanium (Ti), gold (Au), and a combination thereof, or otherwise may contain other conductive materials.

The second electrode transfer unit 150 positioned on the rear surface of the substrate 110 has a second electrode 151, and a plurality of second collector regions 152 containing a plurality of second collectors 1521.

The second electrode 151 contains a conductive material, such as aluminum (Al), and is electrically connected to the substrate 110.

The second electrode 151 collects the charges, for example, electrons, moving from the substrate 110, and outputs them to an external device.

The second electrode 151 may contain, instead, of aluminum (Al), at least one selected from the group consisting of nickel (Ni), copper (Cu), silver (Ag), tin (Sn), zinc (Zn), indium (In), titanium (Ti), gold (Au), and a combination thereof, or otherwise may contain other conductive materials.

Figure 3:
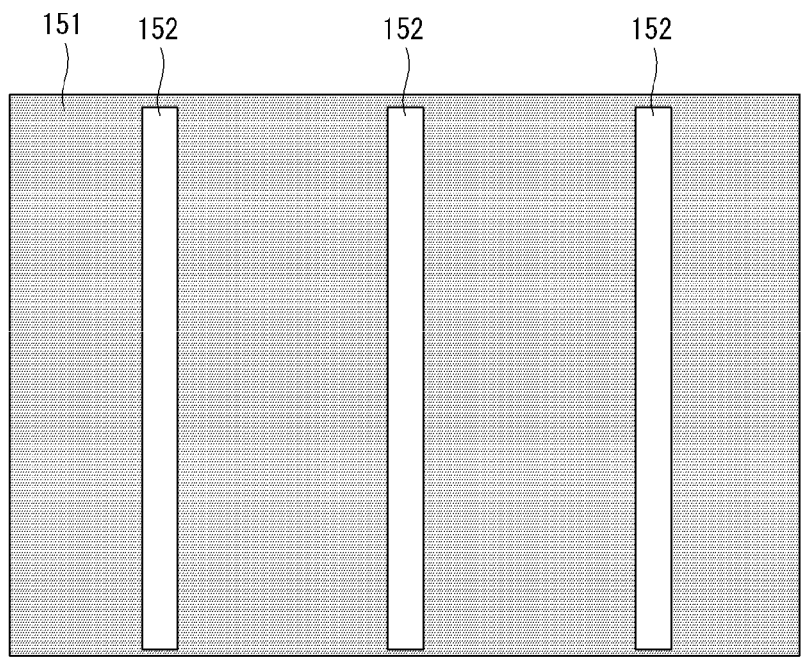
FIG. 3 is a view showing one example of second collector units of the solar cell shown in FIG. 1.

The plurality of second collector regions 152 are mainly positioned at portions facing the first collector regions 142, and as shown in FIG. 3, have a stripe (or strip) shape which extends almost in parallel without interruption almost to the ends of the substrate 110. Due to this, the second electrode 151 is positioned on an almost entire rear surface of the substrate 110, except where the plurality of second collector regions 152 and the plurality of second collectors 1521 are positioned.

The second collectors 1521 contain a conductive material, such as silver (Ag), and are electrically and physically connected to the second electrode 151.

The second collectors 1521 collect the charges transferred from the second electrode 151, and output the charges to an external device.

In the example embodiment, the second collector regions 152 and the first collector regions 142 have the same number of the respective collectors, and the second collector regions 152 partially overlap with the adjacent second electrode 151, but the present invention is not limited thereto.

The plurality of second collectors 1521 may contain, instead of silver (Ag), at least one conductive material selected from the group consisting of aluminum (Al), nickel (Ni), copper (Cu), tin (Sn), zinc (Zn), indium (In), titanium (Ti), gold (Au), and a combination thereof, or otherwise may contain other conductive materials.

The back surface field 171 is positioned between the substrate 110 and the second electrode 151, and is a region, for example, a p+ region, which is doped with an impurity of the same conductive type as the substrate 110, at a higher concentration than that of the substrate 110.

Due to a difference in the concentration of an impurity between the substrate 110 and the back surface field 171, a potential barrier is formed, and this distributes (or disrupts) the movement of electrons toward the rear surface of the substrate 110, thereby reducing or preventing a recombination and/or a disappearance of electrons and holes near the rear surface of the substrate 110.

The operation of the solar cell 1 having the above structure according to this example embodiment will be described below.

When light is irradiated to the solar cell 1 and incident on the semiconductor substrate 110 through the anti-reflection layer 130 and the emitter layer 120, pairs of electrons and holes are generated in the semiconductor substrate 110 by light energy. At this point, the substrate 110 has a textured surface. Thus, when incident and reflection operations of light are performed on the textured surface, the reflectance of the light decrease and the absorbance of the light increases. Also, the reflection loss of light incident on the substrate 110 is reduced because of the anti-reflection layer 130, thereby further increasing the amount of light incident on the substrate 110.

These pairs of electrons and holes are separated from one another by the p-n junction between the substrate 110 and the emitter layer 120, and therefore the holes move toward the p-conductive type substrate 110 and the electrons move toward the n-conductive type emitter layer 120. In this way, the electrons having moved to the emitter layer 120 are collected by the plurality of first electrodes 141 and transferred to the plurality of first collectors 1421, while the holes having moved to the substrate 110 are collected by the second electrode 151 and transferred to the plurality of second collectors 1521. Then, the first collectors 1421 in the first collector regions 142 and the second collectors 1521 in the second collector regions 152 are connected to each other using electric wires, and thus current flows therebetween. The current is externally used as an electric power.

Next, various examples of the first collector regions 142 containing the first collectors 1421 according to example embodiments of the present invention will be described with reference to FIG. 1 and FIGS. 4 to 16. In the following example, components performing the same functions are designated with the same reference numerals, and a detailed description thereof is briefly made or is entirely omitted.

The partial perspective view and cross-sectional view of the solar cell 1 shown in FIGS. 1 and 2 illustrate an application example of the first collector regions 142 shown in FIG. 4. A solar cell to which an example of the first collector regions 142 shown in FIGS. 5 to 16 is applied is identical to the solar cell 1 except the shape of the first collectors 1421 in the first collector regions 142, so a partial perspective view d cross-sectional view of the solar cell of the example shown in FIGS. 5 to 16 will be omitted.

FIGS. 4 to 16 are views showing various examples of the first collector units according to example embodiments of the present invention.

First, referring to FIGS. 1 and 4, one example of the plurality of first collector regions 142 will be described.

As shown in FIGS. 1 and 4, each of the first collector regions 142 has a plurality of first collectors 1421.

Each collector 1421 is branched off from a corresponding portion of each pair of first electrodes 141 in a longitudinal direction and positioned only between each pair of first electrodes 141. Thereby, as shown in FIG. 4, the upper and lower ends of the collector 1421 are connected to the corresponding first electrodes 141 from which they are branched off.

Each collector 1421 has a rectangular shape.

Because each collector 1421 is positioned between each pair of first electrodes 141, the vertical width d23 of each first collector 1421 is almost similar to the distance between each pair of first electrodes 141. In FIG. 4, the plurality of first collectors 1421 of the same first collector region 142 are positioned at almost the same portions in a vertical direction with respect to each other, while the respective pairs of first electrodes 141, to which the first collectors 1421 are respectively connected, are different from each other.

As previously described, the plurality of first collector regions 142 are spaced apart from one another, and extend almost in parallel in a direction crossing the plurality of first electrodes 141. Thus, as shown in FIG. 4, the collectors 1421 positioned between the same pair of first electrodes 141 forms for are included in) a different first collector regions 142.

In this example, the number of collectors 1421 positioned in the same pair of first electrodes 141 is the same as the number of first collector regions 142. Thus, the gaps between neighboring first electrodes 141 in which the plurality of first collectors 1421 are positioned and the gaps between the neighboring first electrodes 141 in which the plurality of first collectors 1421 are not positioned are arranged in an alternate manner. As a result, the plurality of first collectors 1421 forming (or included in) the same first collector region 142 is disposed at a regular distance, and extends discontinuously in one direction. The regular distance is almost the same as the distance between the neighboring two electrodes 141. Therefore, in the first collector regions 142, a plurality of deletions 144 having no collectors 1421 exists in areas S1 formed by virtually connecting both lateral sides of each of the first collector regions 142 shown in FIG. 4 in a vertical direction. In case of FIG. 4, portions formed between the neighboring collectors 1421 correspond to the deletions 144.

In this example, the horizontal width d21 of each first collector 1421 ranges from about 1.5 mm to 3 mm, but the embodiment is not limited thereto.

Due to this, the formation area where the first collectors 1421 is formed in each first collector region 142 is reduced to almost half, compared to a comparative example in which a plurality of first collector regions have a predetermined width and a predetermined length and have a stripe shape which extends across a plurality of first electrodes 141 without interruption. Accordingly, the manufacturing cost of the plurality of first collector regions 142 is reduced compared to the comparative example, thereby reducing the manufacturing cost of the solar cell 1.

Next, another example of the plurality of first collector regions 142 will be described with reference to FIG. 5.

In this example, the plurality of first collector regions 142 is almost similar to the example of the first collector regions 142 shown in FIG. 4.

That is, each first collector region 142 has a plurality of collectors 1421 positioned between each pair of first electrodes 141, and hence the plurality of collectors 1421 is disposed at a regular distance.

Unlike FIG. 4, however, each first collector region 142 additionally has a plurality of connecting regions 143 for connecting two neighboring collectors 1421. In other words, the plurality of connection regions 143 are positioned between neighboring first electrodes 141 where the plurality of collectors 1421 are not positioned, that is, between two pairs of neighboring first electrodes 141, and therefore the collectors 1421 and the connecting regions 143 are alternately positioned between the continuous first electrodes 141.

Accordingly, in the same collector region 142, the collectors 1421 and the connecting regions 143 are alternately positioned in a longitudinal direction. Thus, unlike FIGS. 1 and 4, the plurality of collectors 1421 forming each collector region 142 is electrically and physically connected by the plurality of connecting regions 143.

Figure 5:
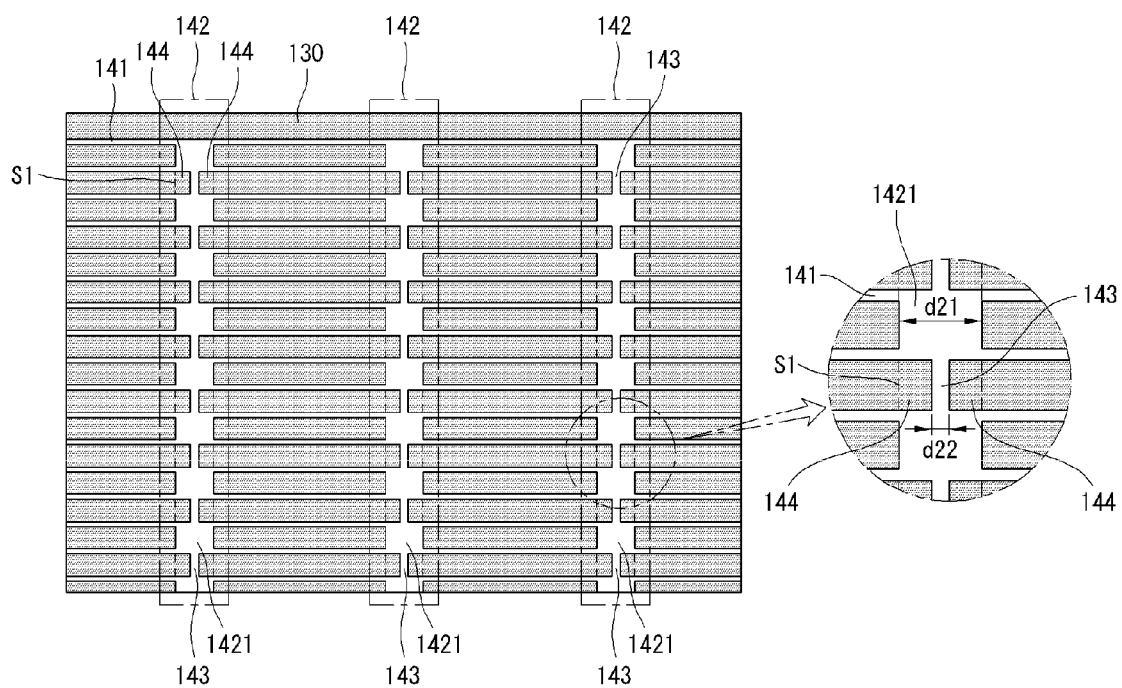

Also, in FIG. 5, the positions of the plurality of collectors 1421 and the plurality of connecting regions 143 in two neighboring collector regions 142 are identical to each other, but they may be different from each other.

In the same manner as FIG. 4, a plurality of deletions 144 having no collectors 1421 exist in areas S1 formed by vertically connecting both lateral sides of each of the plurality of first collectors 1421, that is, areas formed by vertically and linearly connecting both lateral sides of each first collector region 142. In FIG. 5, both side portions of the connecting regions 143 correspond to the deletions 144.

In this example, the horizontal width d22 of each connecting region 143 is smaller than the horizontal width d21 of each collector 1421. In one example, the horizontal width d22 of each connecting region 143 ranges from approximately 0.05 mm to 1 mm.

In this example, the plurality of connecting regions 143 are formed of the same material as the plurality of first collectors 1421 on the same layer, but may be formed of a different conductive material from that of the plurality of first collectors 1421.

Due to this, the formation area of the first collectors 1421 in each first collector region 142 is reduced when compared to the comparative example in which a plurality of collector regions have a stripe shape which extends across a plurality of first electrodes 141 without the deletions 144, thus reducing the manufacturing cost of the solar cell 1 compared to the comparative example. Moreover, in comparison with FIGS. 1 and 4, the area of each first collector region 142 is increased and hence the contact area with an external device is also increased, thereby increasing the transfer rate of charges due to the increase of the contact force with an external device.

Figure 6:
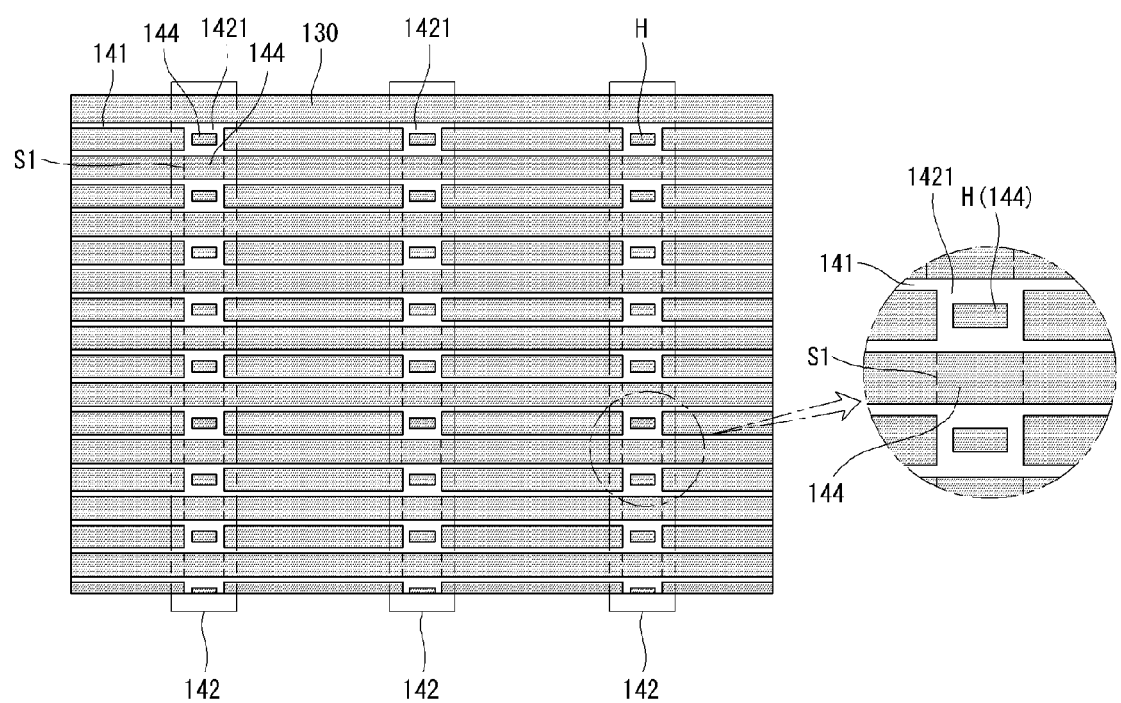

In the example shown in FIG. 6, the plurality of first collector regions 142 is identical to the first collector regions 142 shown in FIG. 4 except the shape of the collectors 1421.

That is, unlike FIGS. 1 and 4, the plurality of first collectors 1421 forming (or included in) each first collector region 142 have a rectangular ring shape where a hole H is formed at the center portion thereof, respectively. The shape of the hole H in FIG. 6 is rectangular, but the embodiment is not limited thereto, and the hole H may have various shapes such as a circular shape. In this case, the plurality of deletions 144 existing in the areas S1 formed by vertically connecting both lateral sides of the plurality of first collectors 1421 corresponds to portions between neighboring collectors 1421 and hole H portions.

Comparing this example with FIG. 4, the area of the first collectors 1421 is smaller than the area of the first collectors 1421 shown in FIG. 4, thereby further reducing the manufacturing cost of the solar cell 1.

Figure 7:
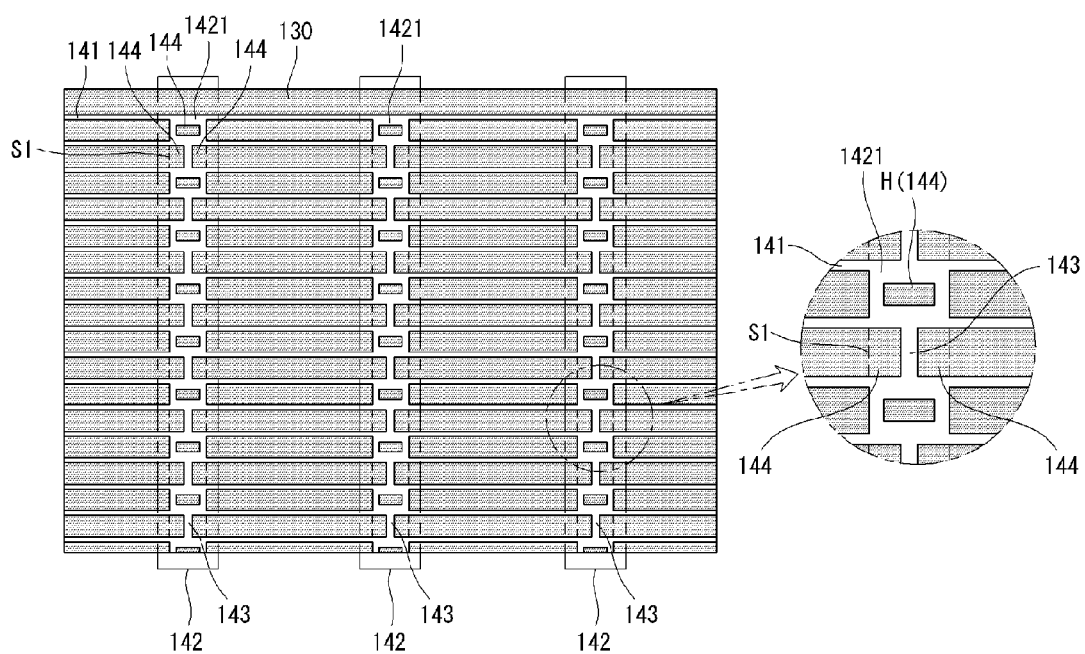

In an example shown in FIG. 7, the plurality of first collectors 1421 shown in FIG. 6 are electrically and physically connected by the plurality of connecting regions 143 shown in FIG. 5. Thus, a detailed description thereof will be omitted.

The example shown in FIG. 7 illustrates a case where the plurality of first collectors 1421 shown in FIG. 6 are electrically and physically connected by the plurality of connecting regions 143 shown in FIG. 5, so a detailed description thereof is omitted.

In this case, the plurality of deletions 144 existing in the areas S1 formed by vertically connecting both lateral sides of the plurality of first collectors 1421 corresponds to both side portions of the connecting regions 143 and the hole H portions.

In the case of FIG. 7, the area of the first collectors 1421 is reduced like in FIG. 6, thereby reducing the manufacturing cost of the solar cell 1. Also, as shown in FIG. 5, the contact area with an external device increases and hence the transfer rate of charges also increases.

In FIG. 1 and FIGS. 4 to 7, the plurality of first collectors 1421 positioned in the same first collector region 142 all have the same shape, but it may be also possible to provide a plurality of first collectors 1421 having two or more different shapes in an alternative example. In addition, each first collector 1421 may have various shapes other than the previously mentioned shapes.

Next, referring to FIG. 8, another example of the plurality of first collector regions 142 will be described.

Figure 8:
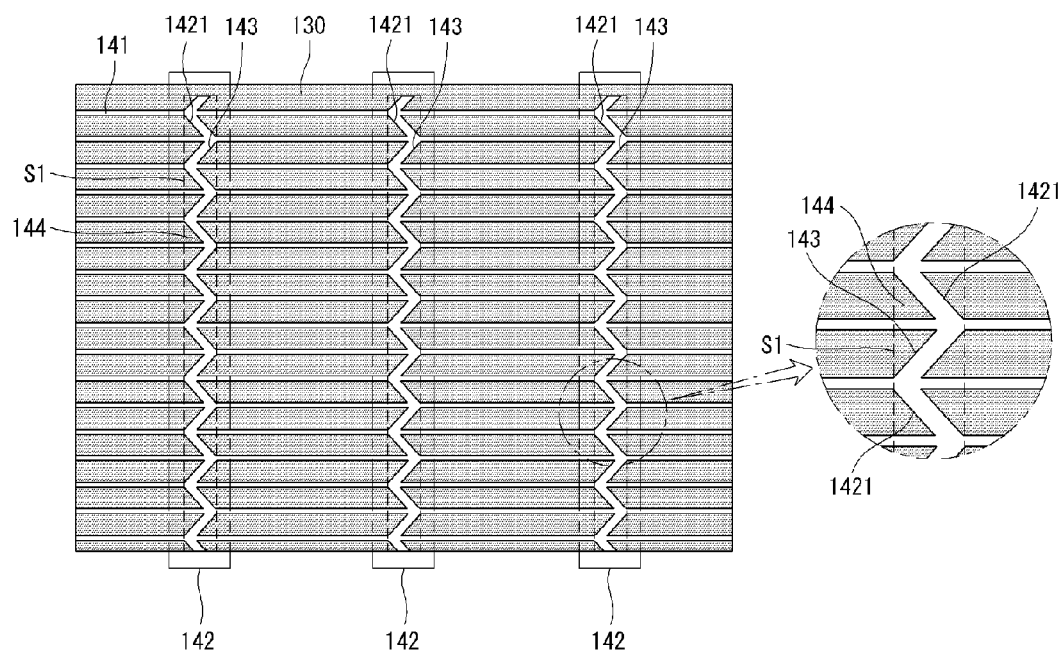

As shown in FIG. 8, each first collector region 142 also has a plurality of first collectors 1421 positioned between each pair of first electrodes 141 and a plurality of connecting regions 143 connecting neighboring first collectors 1421.

However, each first collector 1421 is obliquely positioned between a pair of first electrodes 141, and each connection region 143, too, is obliquely positioned between two neighboring first collectors 1421.

In addition, the first collectors 1421 and the connecting regions 143 have the same horizontal width, and neighboring first collectors 1421 and neighboring connecting regions 143 are vertically symmetrical. Thus, each first collector region 142 has a shape which continuously extends across the plurality of first electrodes 141 without interruption in a zigzag fashion.

Figure 9:
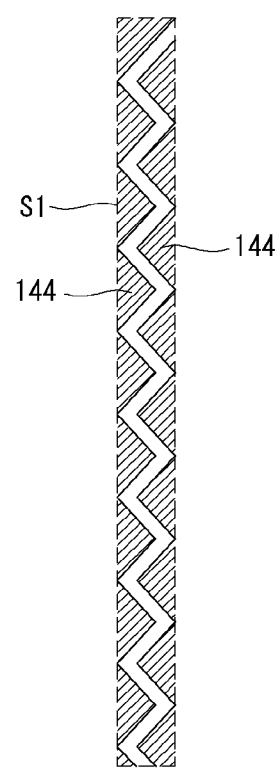

At this point, as shown in FIG. 9, the plurality of deletions 144 exist alternately at the left and right parts with respect to the first collectors 1421 and the connecting regions 143 in the areas S1 formed by virtually connecting both lateral sides of the plurality of first collectors 1421, that is, the areas formed by vertically and linearly connecting both lateral sides of each first collector region 142. In FIG. 9, the deletions 144 have a triangular shape, and thus the zigzags have a triangular saw-toothed shape.

Figure 10:
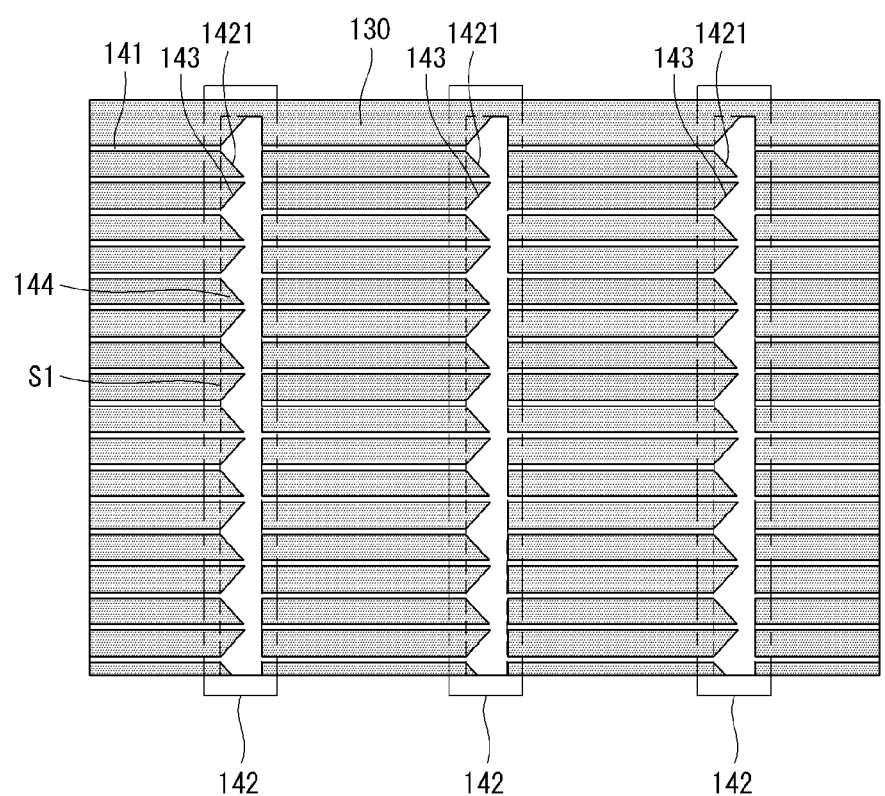
Figure 11:
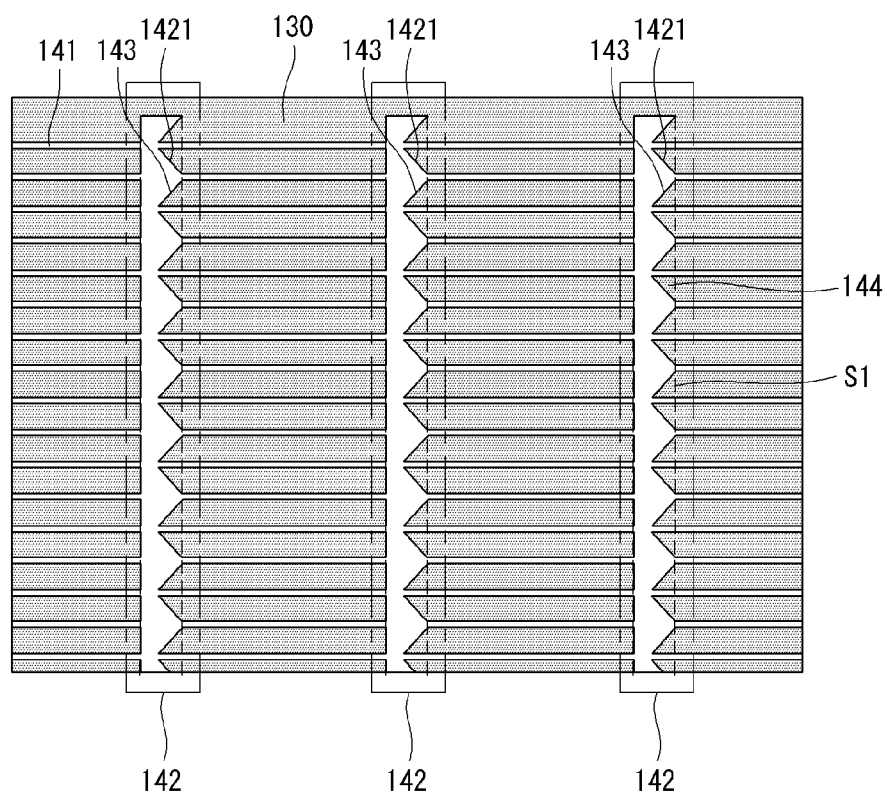

Unlike this example, the triangular-shaped deletions 144 may only exist at either the left parts or the right parts. Thus, as shown in FIGS. 10 and 11, either the right sides or the left sides of the first collector regions 142 have a linear shape, while either the right sides or the left sides, which are the opposite sides, have triangular-shaped deletions 144. Accordingly, the left sides or the right sides, which are opposite to the sides having the linear shape, have a triangular saw-toothed shape.

Figure 12:
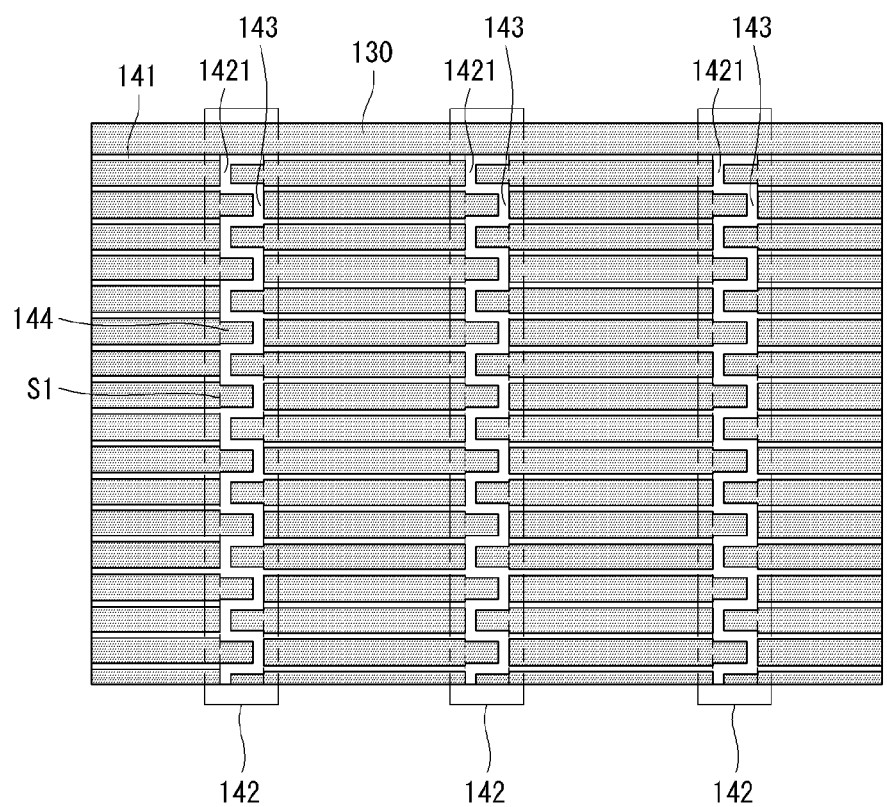

In another example of the first collector regions 142 shown in FIG. 12, similarly to FIG. 8, each first collector region 142 has first collectors 1421 positioned between pairs of first electrodes 141 and having a "⊏"-shape, and connecting regions 143 perpendicularly connecting neighboring collectors 1421, and hence has an integrated shape which continuously extends without interruption in a zigzag fashion.

Figure 13:
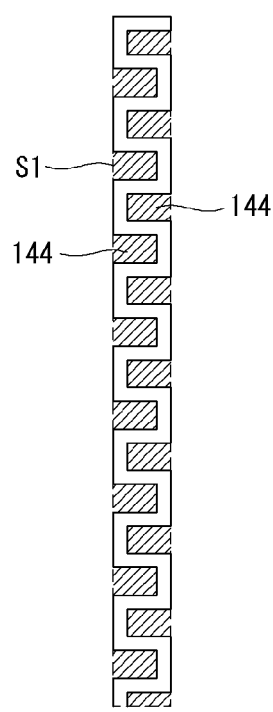

However, as shown in FIG. 13, the plurality of deletions 144, which exist alternately at the left and right parts with respect to the first collectors 1421 and the connecting regions 143 in the areas S1 formed by virtually connecting both lateral sides of the plurality of first collectors 1421, have a rectangular shape. Due to this, the zigzags a rectangular saw-toothed shape.

Figure 14:
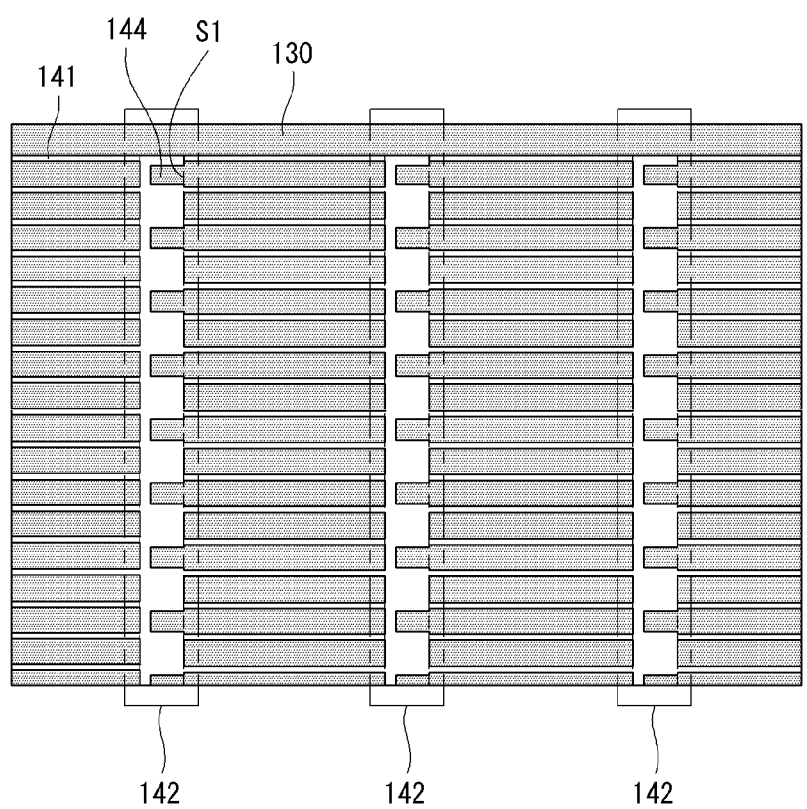
Figure 15:
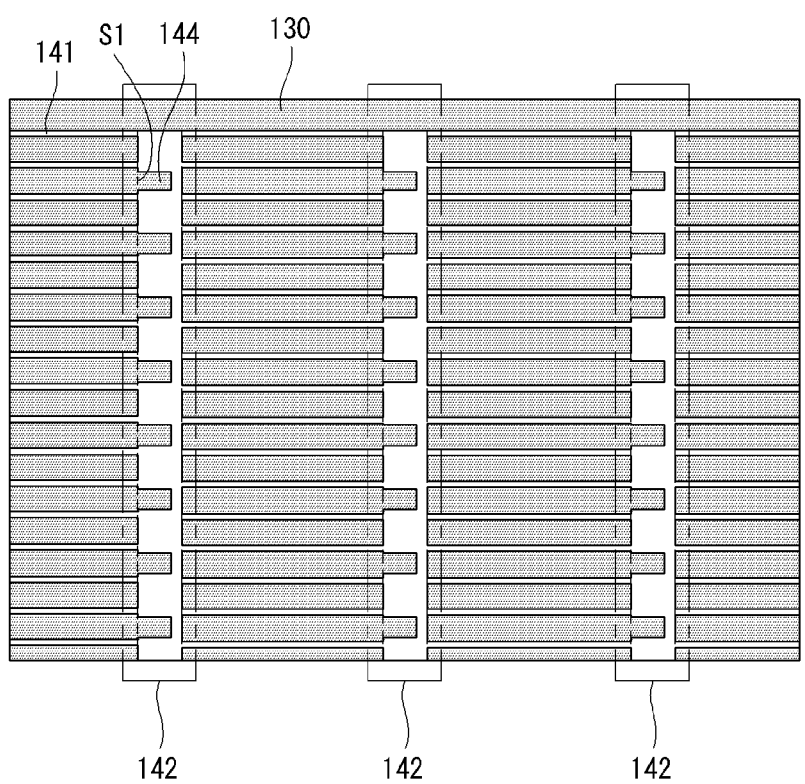

At this point, similarly to those shown in FIGS. 10 and 11, the plurality of deletions 144 having a rectangular shape only exist at either the left parts or the right parts. Thus, as shown in FIGS. 14 and 15, either the right sides or the left sides of the first collector regions 142 have a linear shape, while either the right sides or the left sides, which are the opposite sides, have rectangular-shaped deletions 144. Accordingly, the left sides or the right sides, which are opposite to the sides having the linear shape, have a rectangular saw-toothed shape.

Comparing the example shown in FIGS. 8 to 15 with the comparative example where the plurality of collector regions have a stripe shape which extends across the plurality of first electrodes 141, the formation area of the first collectors 1421 in each of the first collector regions 142 is decreased in FIGS. 8 to 15, thereby making the manufacturing cost of the solar cell 1 smaller than that in the comparative example.

Figure 16:
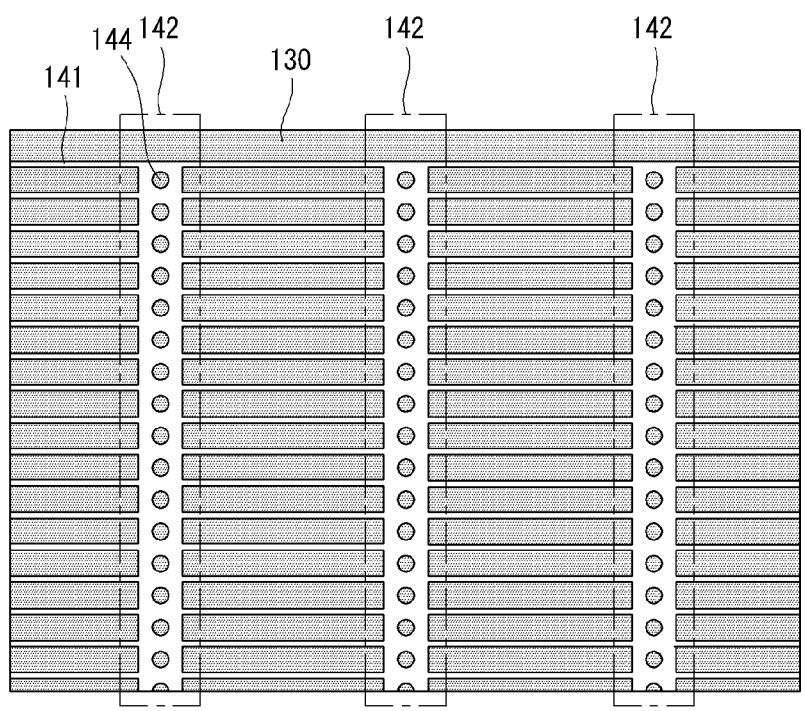

Another example of the first collector regions 142 shown in FIG. 16 has a plurality of deletions 144 and has a stripe (or strip) shape which extends across the plurality of first electrodes 141. Accordingly, both lateral sides of the first collector regions 142 have a linear shape but the first collector regions 142 have the plurality of deletions 144 formed therein, thereby reducing the manufacturing cost of the first collector regions 142. At this point, the plurality of deletions 144 existing in each collector region 142 may have various shapes other than a circular shape, and may be regularly or randomly arranged.

The shape of the deletions 144 shown in FIGS. 8 to 16 is an example, and the deletions 144 may have various shapes such as a circular shape, an elliptical shape, a semi-circular shape, semi-elliptical shape, and a polygonal shape such as a triangular shape and a rectangular shape. In addition, although the deletions 144 are positioned between each pair of neighboring first electrodes 141 in FIGS. 8 to 15, they also may be arranged at regular distances, for example, between every two pairs of first electrodes 141 and the arrangement positions may be varied.

Also, in the example shown in FIGS. 8 to 16, the ratio of the plurality of deletions 144 in the virtual areas S1 is greater than about 10% to less than about 100% with respect to the total area of the virtual areas S1. Due to this, the area of the first collector regions 142 is reduced by greater than about 10% to less than about 100% compared to the comparative example in which the plurality of first collector regions have a stripe shape.

In this way, the shapes of the first collector regions 142 described with reference to FIGS. 4 to 16 are used as another example of the second collector regions 152 shown in FIG. 3.

Next, various examples of the second collector regions 152 according to example embodiments of the present invention will be described with reference to FIGS. 17 to 27.

FIGS. 17 to 27 are views showing various examples of the second collector regions according to example embodiments of the present invention.

Figure 17:
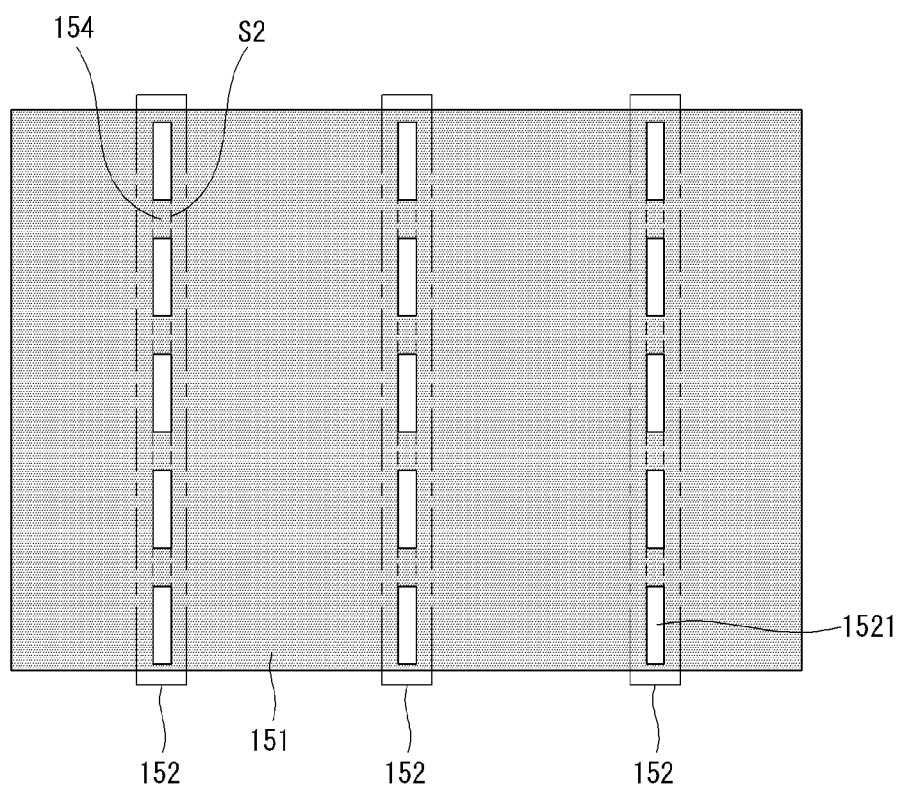
FIGS. 17 to 27 are views showing various examples of the second collector units according to embodiments of the present invention.
Figure 18:
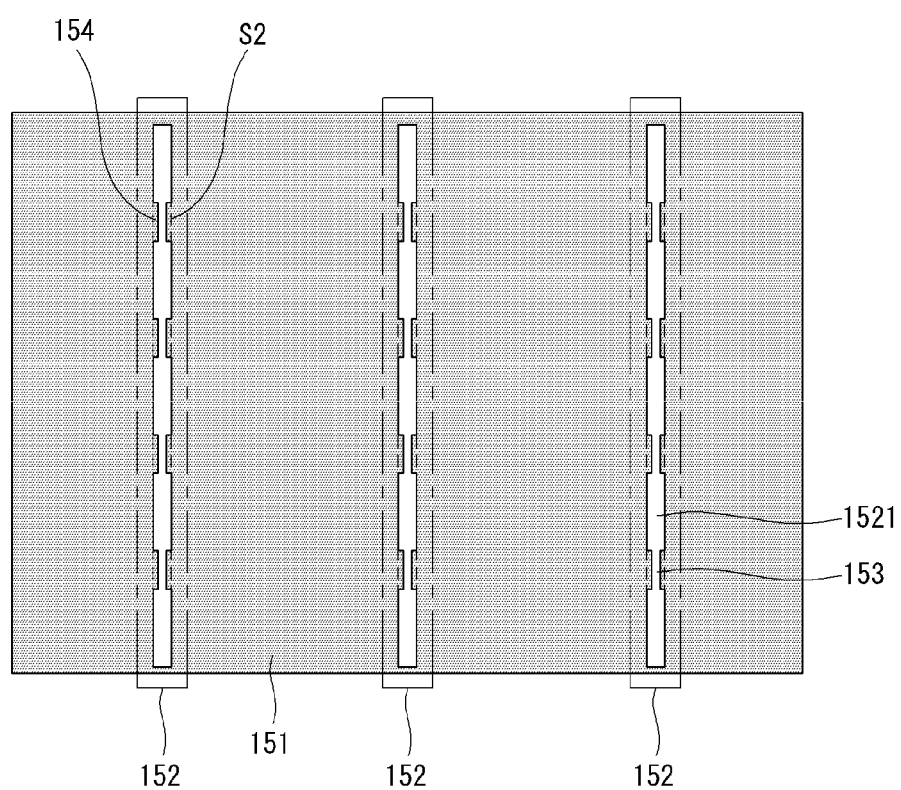
Figure 19:
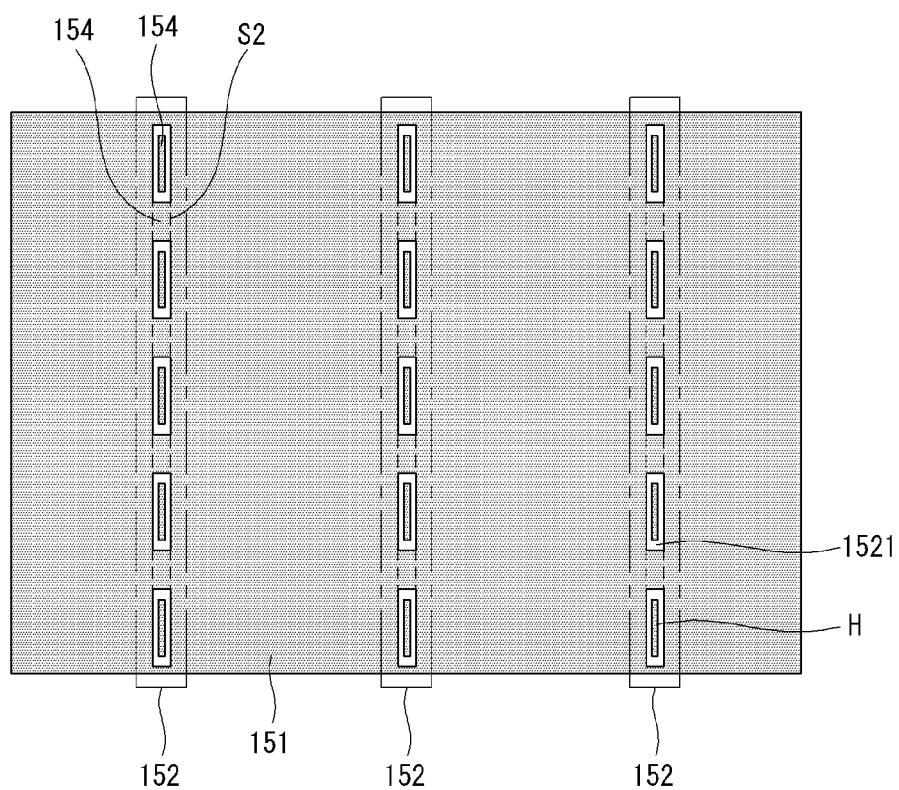
Figure 20:
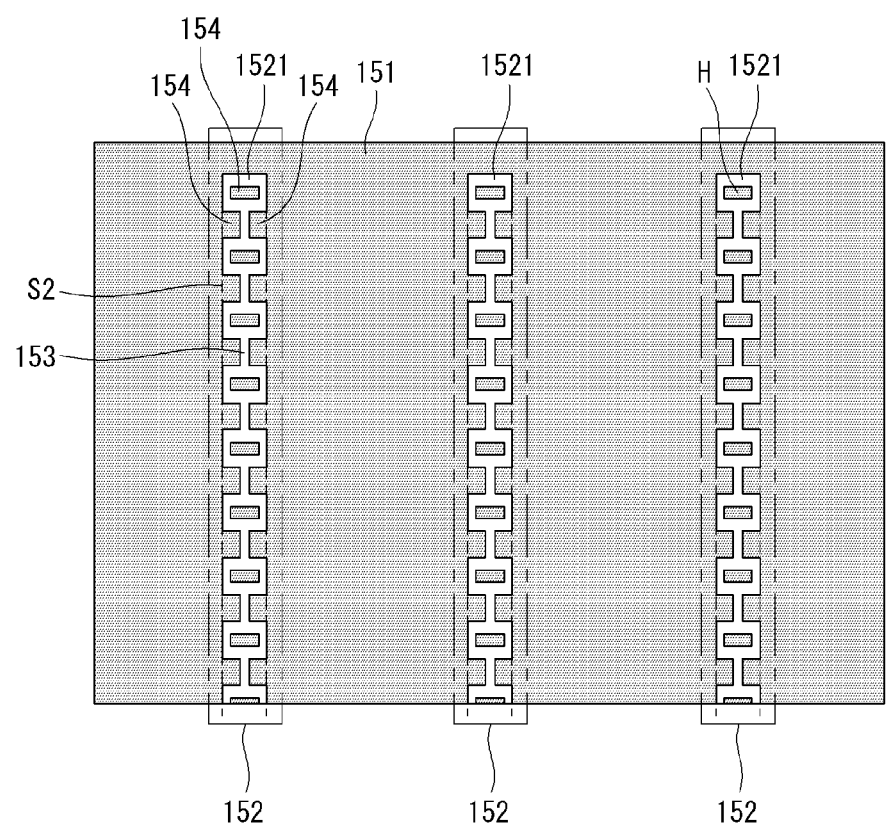
Figure 21:
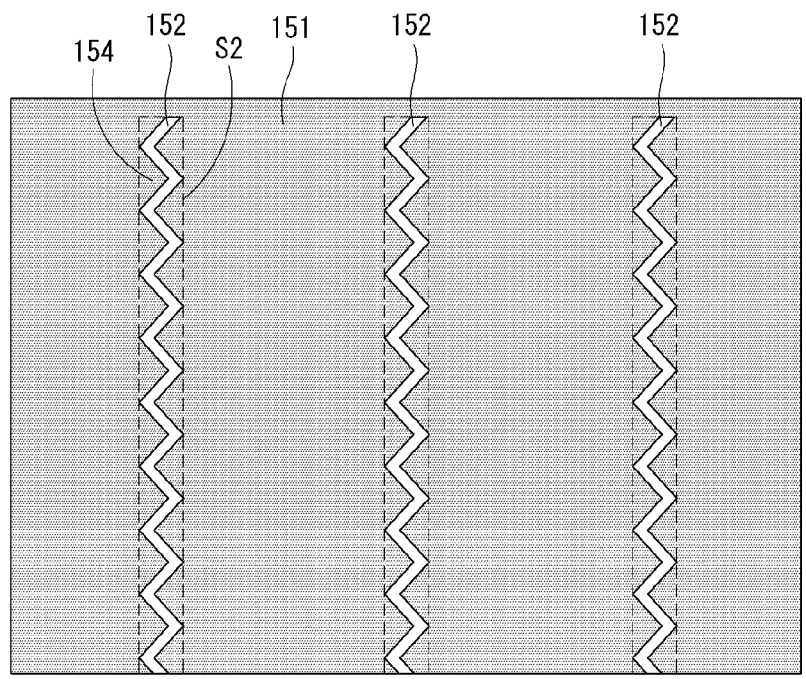
Figure 22:
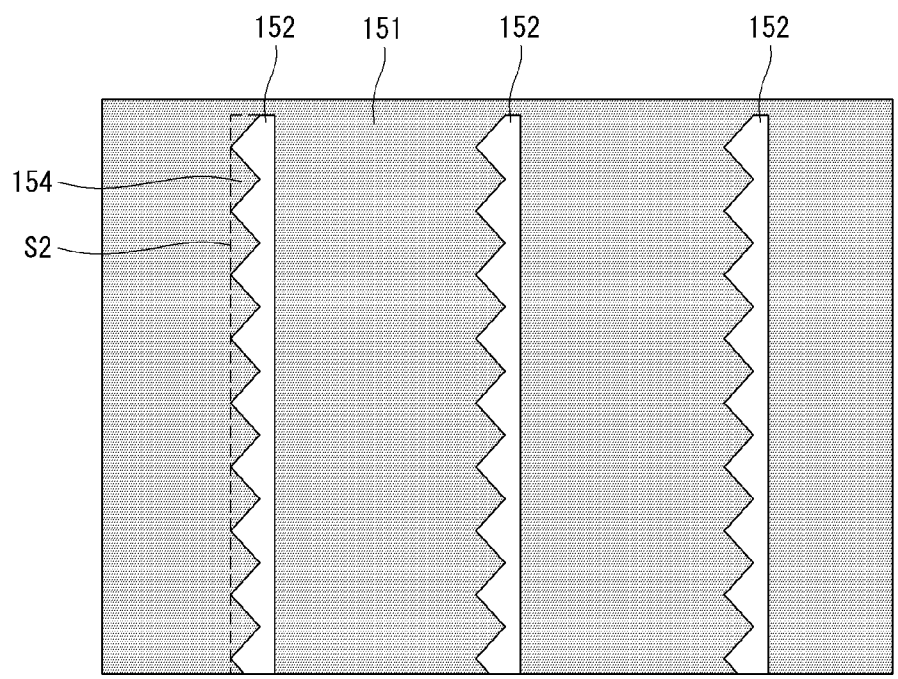
Figure 23:
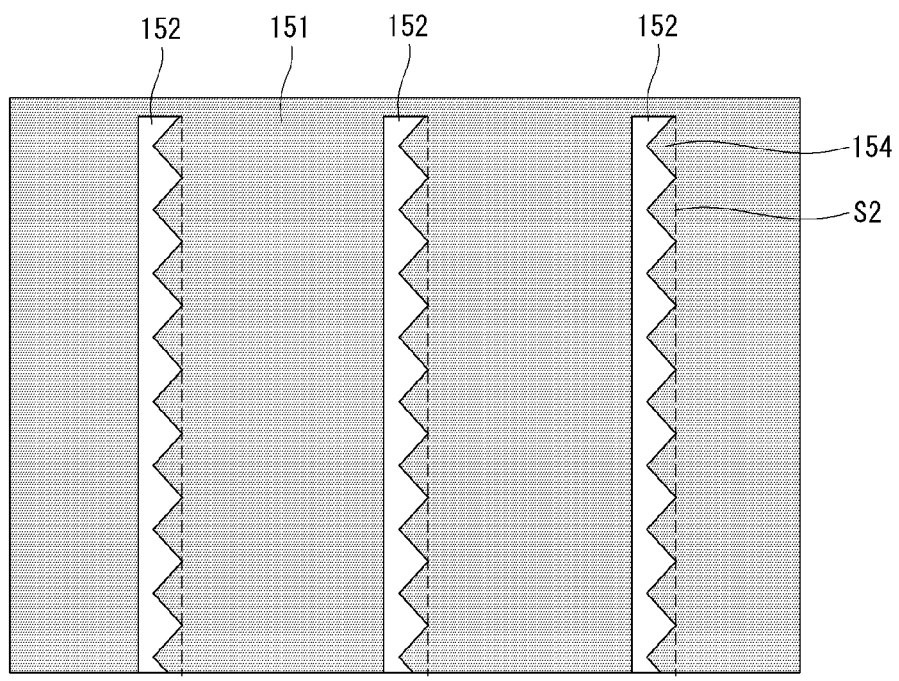
Figure 24:
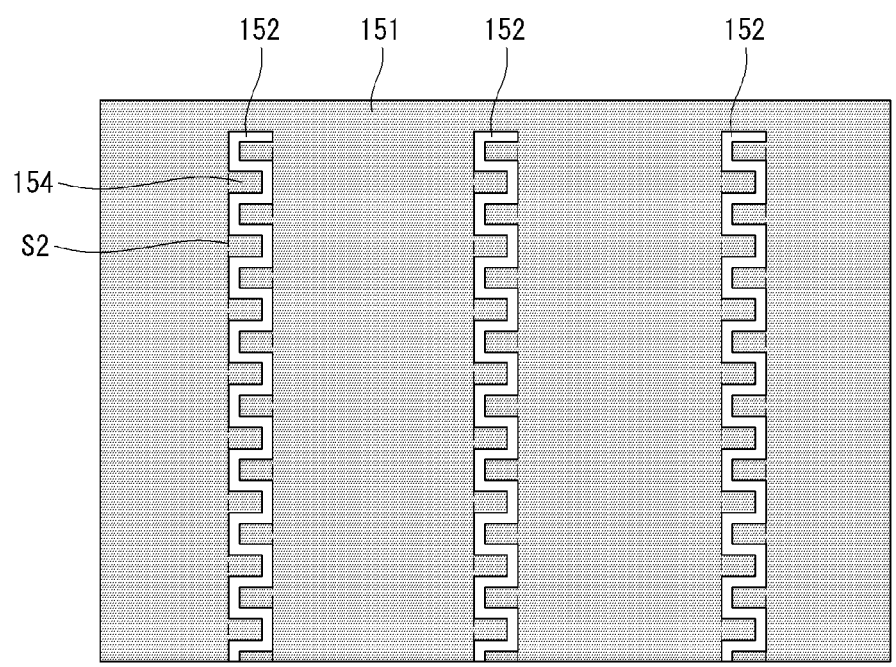
Figure 25:
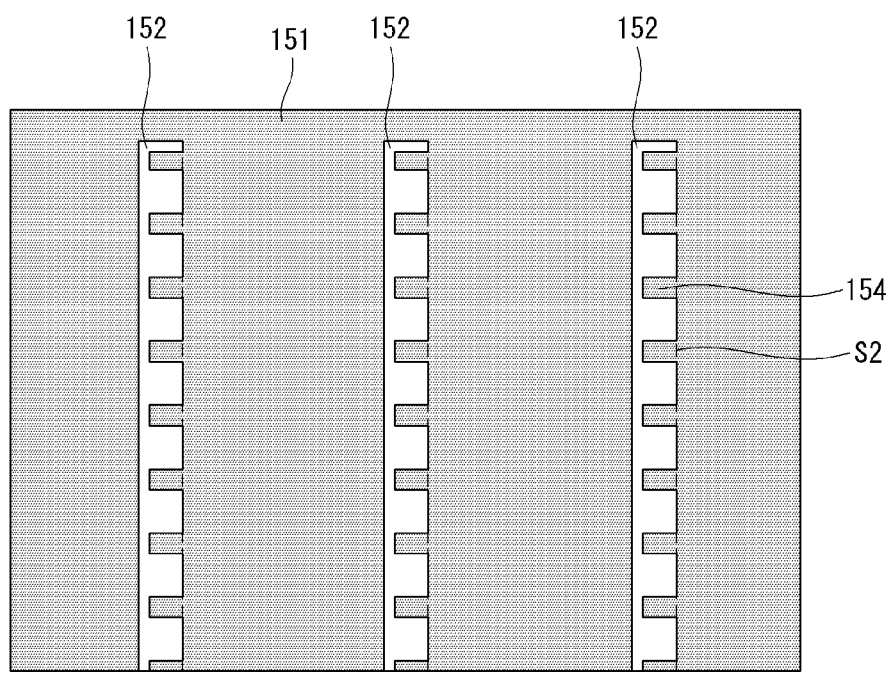
Figure 26:
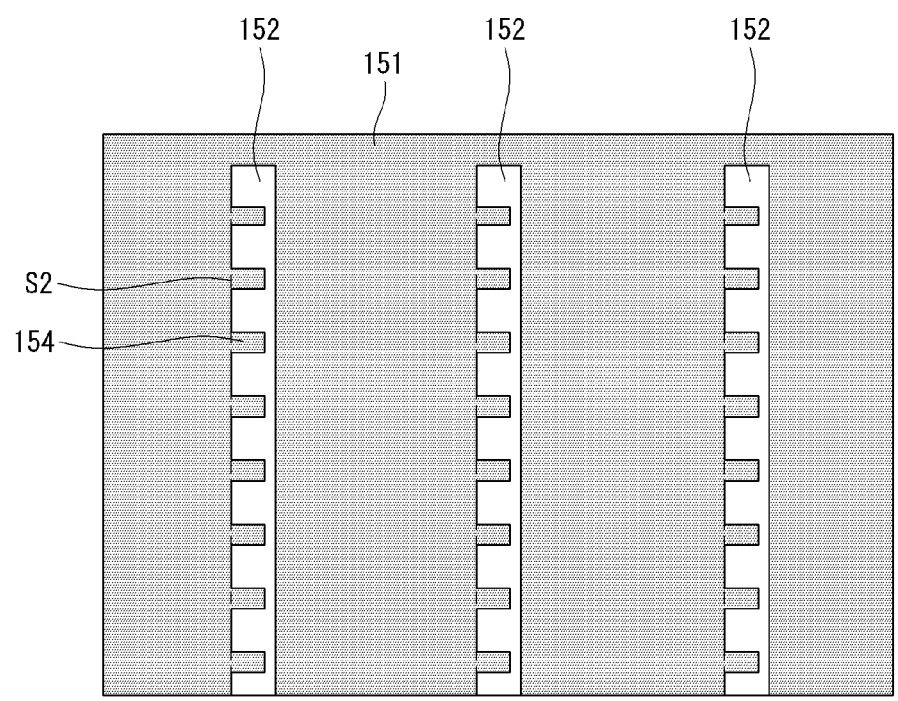
Figure 27:
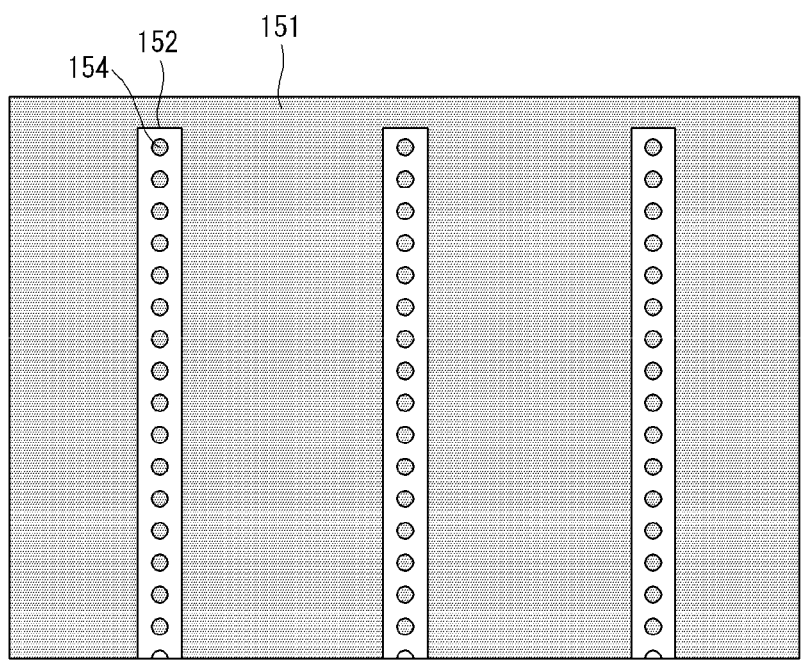

That is, as shown in FIGS. 17 and 19, each second collector region 152 has a plurality of second collectors 1521 formed on the rear surface of the substrate 110, or as shown in FIGS. 18 and 20, has a plurality of second collectors 1521 and a plurality of connecting regions 153 electrically and physically connecting the plurality of second collectors 1521 to each other.

Thus, a plurality of deletions 154 are provided in areas S2 formed by virtually connecting both lateral sides of the plurality of second collectors 1521 in the same manner as the first collector regions 142.

At this point, as shown in FIGS. 17 and 20, the size, frequency count, a formation distance, etc., of the collectors 1421 for the first collector region 142 are different from those of the second collectors 1521, but the present invention is not limited thereto.

In addition, as shown in FIGS. 21 to 27, each second collector region 152 has a zigzag pattern of a triangular saw-toothed or rectangular saw-toothed shape, or a plurality of deletions 154 are provided in the internal areas of the second collector regions 152.

At this point, the size or the number of deletions 154 for the plurality of second collector regions 152 may be increased or decreased in a similar way as the deletions 144 for the plurality of first collector regions 142 so as to decrease or increase the formation area of the plurality of second collector regions 152 as was the case with the plurality of first collector regions 142.

In such an example, similarly to the first collector regions 142, the formation area of the second collector regions 152 in FIG. 3 is decreased in which the plurality of second collector regions 152 have a stripe shape, so that the material cost of the second collector regions 152 can be reduced, thereby reducing the manufacturing cost of the solar cell 1. Further, the formation area of the back surface field 171 is increased as much as a reduction in the formation area of the second collector regions 152, and hence a reduction in the recombination rate of electrons and holes caused by the back surface field 171 becomes more prominent, thereby further improving the efficiency of the solar cell 1.

In this way, when the plurality of first collector regions 142 positioned on an incident surface and the plurality of second collector regions 152 positioned on the rear surface of the substrate 110, which is opposite to the incident surface, are formed in various shapes, the plurality of first collector regions 142 and the plurality of second collector regions 152 may have the same shape and are formed at positions facing each other with respect to the substrate 110, whereby the plurality of first collector regions 142 and the plurality of second collector regions 152 may overlap with each other.

In this case, a deterioration of the solar cell 1 is reduced and hence the reliability of the solar cell 1 is improved.

That is, on the incident surface of the substrate 110, a larger amount of light is incident to the portion of the anti-reflection layer 130 exposed to the outside because the plurality of first collectors 1421 are not positioned thereon, rather than being incident to the portions where the plurality of first collectors 1421 are formed. Thus, the temperature of the portion of the substrate 110 positioned under the anti-reflection layer 130 exposed to the outside is higher than the temperature of the portion of the substrate 110 positioned under the plurality of the first collectors 1421, and this leads to the generation of much heat.

Accordingly, in case the plurality of first collectors 1421 and the plurality of second collectors 1521 have the same formation positions and pattern, with the substrate 110 interposed therebetween, heat generated from the portion of the substrate 110 where the first collectors 1421 are not formed is easily emitted to the outside through the rear surface of the substrate 110 where the second collectors 1521 are not positioned. Due to this, it is easy to emit the heat generated from the solar cell 1, and hence a deterioration of the solar cell 1 is reduced.

Next, another example embodiment of the present invention will be described with reference to FIGS. 28 to 31. In comparison with FIGS. 1 and 2, components performing the same functions are designated with the same reference numerals, and a detailed description thereof is omitted.

Figure 28:
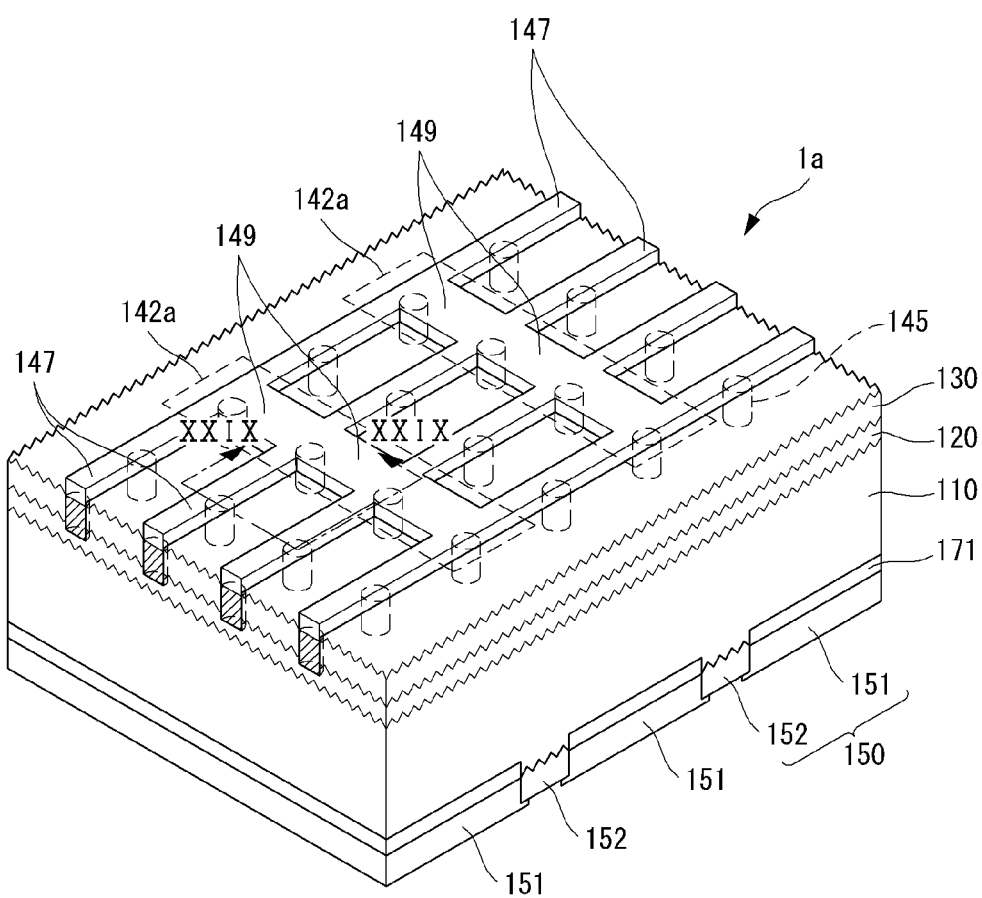
FIG. 28 is a partial perspective view of one example of a solar cell according to another example embodiment of the present invention.
Figure 29:
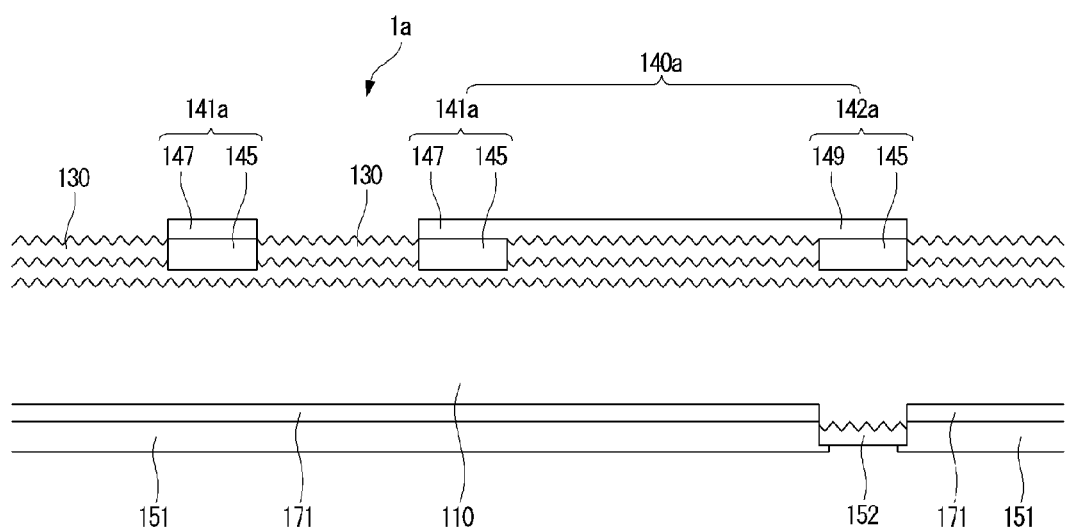
FIG. 29 is a cross-sectional view taken along line XXIX-XXIX of FIG. 28.
Figure 30:
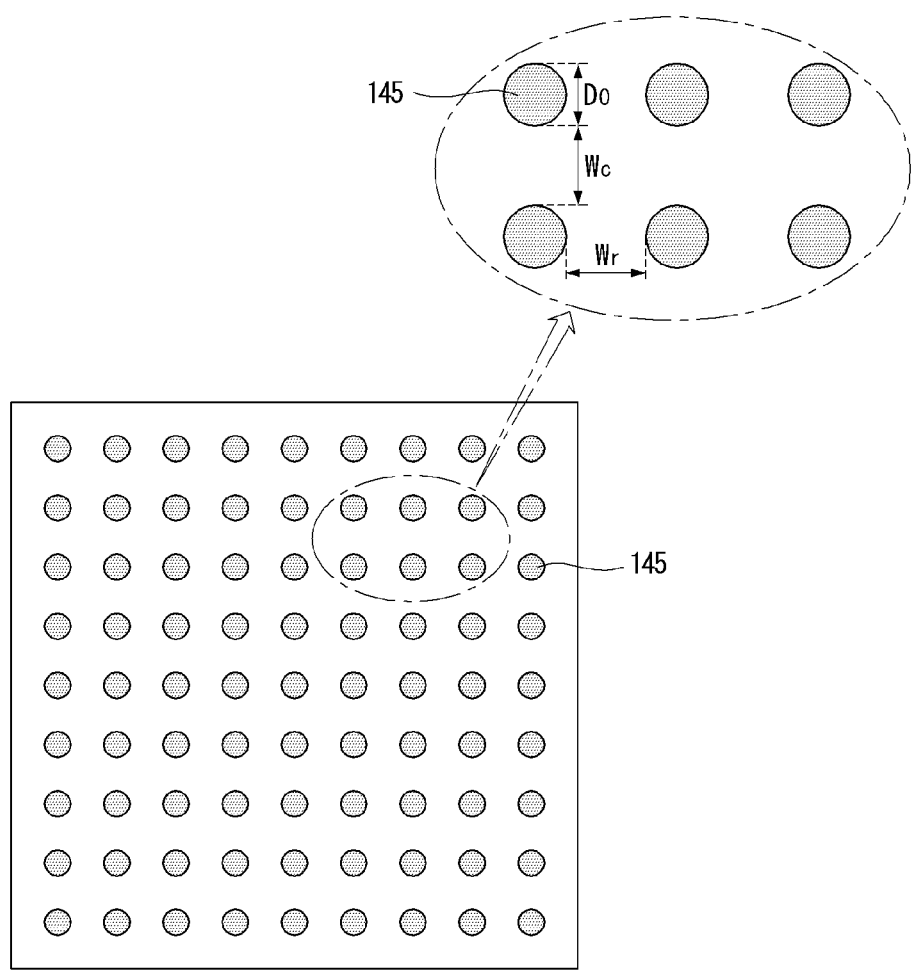
FIG. 30 is a view showing the arrangement state of a plurality of point contacts in one example of the solar cell according to another example embodiment of the present invention.
Figure 31:
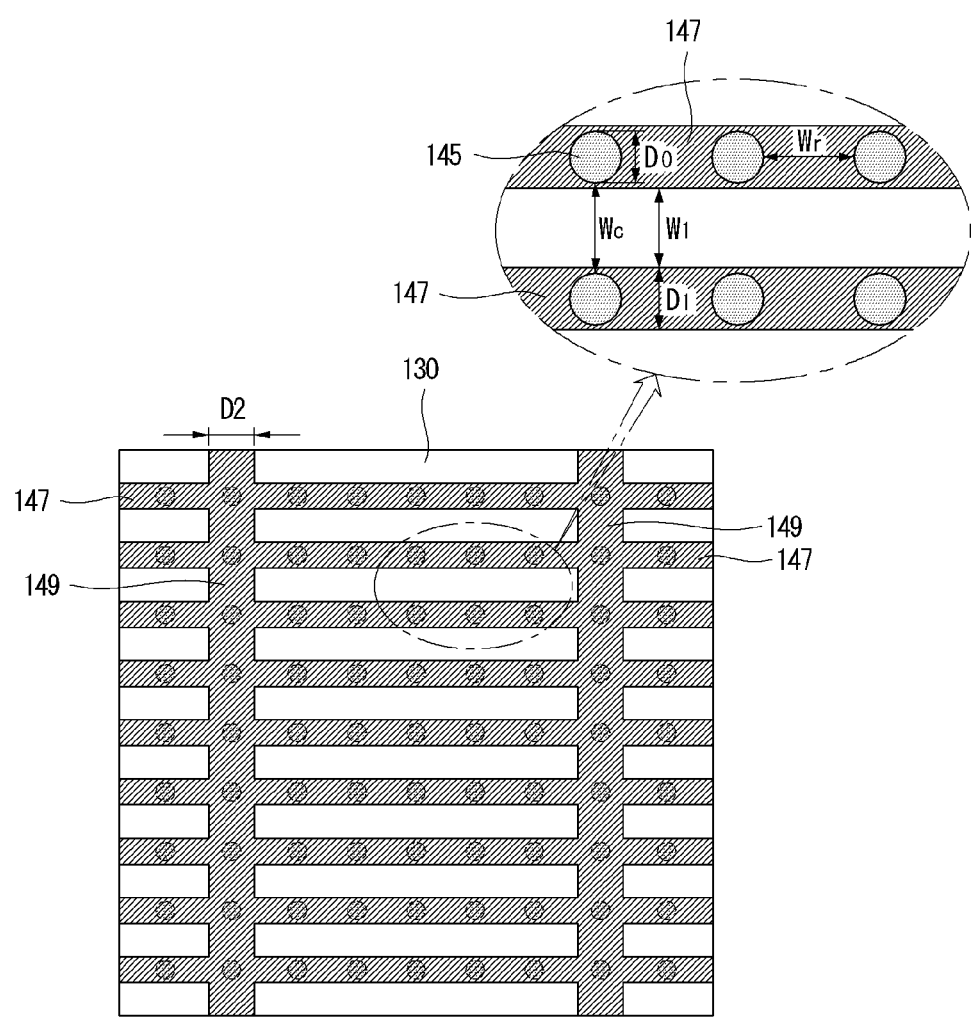
FIG. 31 is a view showing a state where a plurality of first and second metal films are formed on the plurality of point contacts in a solar cell according to another example embodiment of the present invention.
Figure 32:
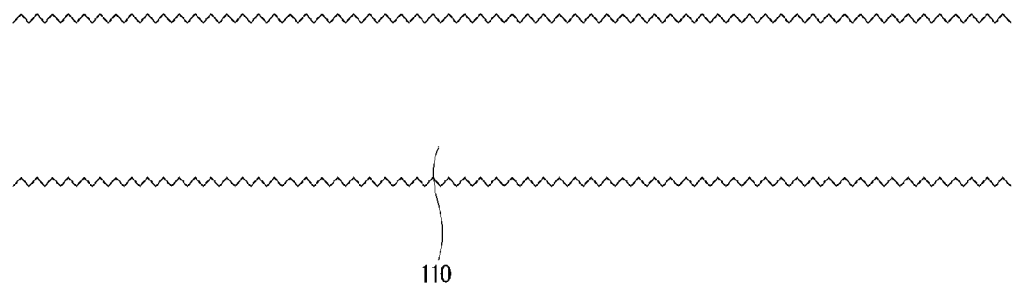

FIG. 28 is a partial perspective view of one example of a solar cell according to another example embodiment of the present invention. FIG. 29 is a cross-sectional view taken along line XXIX-XXIX of FIG. 28. FIG. 30 is a view showing the arrangement state of a plurality of point contacts in one example of the solar cell according to another example embodiment of the present invention. FIG. 31 is a view showing a state where a plurality of first and second metal films (or plurality of first and second strips) is formed on (or includes) the plurality of point contacts in a solar cell according to another example embodiment of the present invention.

A solar cell 1a shown in FIGS. 28 and 29 has a similar structure to that of the solar cell 1 shown in FIGS. 1 and 2.

That is, the solar cell 1a according to this example embodiment includes a substrate 110, an emitter layer 120 positioned on the front surface of the substrate 110, an anti-reflection layer 130 positioned on the emitter layer 120, a first charge transfer unit 140a electrically connected to the emitter layer 120, a second charge transfer unit 150 positioned on the rear surface of the of the substrate 110, and a back surface field 171 positioned between the substrate 110 and the second charge transfer unit 150.

However, unlike the solar cell 1 shown in FIGS. 1 and 2, the first charge transfer unit 140a has a different structure from that of the first charge transfer unit 140 shown in FIGS. 1 and 2.

The first charge transfer unit 140a according to this example embodiment has a plurality of point contacts 145 disposed at regular distances on the incident surface of the substrate 110 and a plurality of first metal films 147 and a plurality of second metal films 149 which are positioned on the point contacts 145.

The plurality of point contacts 145 and the plurality of first metal films 147 form a plurality of first electrodes 141a, and some of the point contacts 145 and the plurality of second metal films 149 form (or are included in) a plurality of second collector regions 142a.

The first charge transfer unit 140a of this type will be described in detail.

As shown in FIG. 30, the plurality of point contacts 145 are positioned mainly in a matrix on the incident surface of the substrate 110, and are electrically and physically connected to the emitter layer 120. Thus, the plurality of point contacts 145 are collectors that collect charges moved toward the emitter layer 120.

In this example embodiment, each point contact 145 has a circular shape, and the width D0 of the point contacts 145 is about 50 μm to 80 μm. Due to the particle characteristics of a conductive paste, for example, paste containing silver (Ag), used to manufacture the point contacts 145, it is difficult to form the point contacts 145 having a width D0 of less than about 50 μm. Thus, the width D0 of the point contacts 145 is about 50 μm or greater. Also, if the width D0 of the point contacts 145 exceeds about 80 μm, the incident area of light is reduced and therefore the efficiency of the solar cell 1a is lowered.

In addition, the distances Wr and Wc between the point contacts 145 adjacent in row and column directions can be respectively determined in consideration of the movement distance of charges that move toward the emitter layer 120. For instance, the Wr and Wc may be determined based on the magnitude of the resistance of the emitter layer 120 and the minimum movement distance of charges. In this example embodiment, the distances Wr and Wc between neighboring point contacts 145 range from about 2 mm to 3 mm, but the embodiment is not limited thereto.

In this example embodiment, each point contact 145 has a circular shape, but the present invention is not limited thereto and each point contact 145 may have various shapes such as an elliptical shape or a polygonal shape such as a triangular shape and a rectangular shape. Also, in this example embodiment, the distances Wr and Wc between point contacts 145 adjacent in the row and column directions are equal to each other, but the plurality of point contacts 145 may be positioned in the row and column directions at the distances Wr and Wc of different distances.

Such a plurality of point contacts 145 contains a conductive material, such as silver (Ag). However, they may contain, instead of silver (Ag), at least one selected from the group consisting of nickel (Ni), copper (Cu), aluminum (Al), tin (Sn), zinc (Zn), indium (In), titanium (Ti), gold (Au), and a combination thereof, or otherwise may contain other conductive materials.

In comparison with the first electrodes 141 of FIGS. 1 and 2 which have a predetermined width and length, extend almost m parallel in a predetermined direction, and are in contact with the emitter layer 120, the contact area between the plurality of point contacts 145 and the emitter layer 120 is greatly reduced.

Due to this, charge loss caused by a recombination of electrons and holes generated in the contact areas between the emitter layer 120 and the point contacts 145 is reduced, thereby lengthening the duration of charges and improving the efficiency of the solar cell 1a.

The plurality of first metal films 147 has a stripe (or a strip) shape in which they are positioned on (or includes) the plurality of point contacts 145 (hereinafter, 'the plurality of contact point rows' or 'the plurality of contact point columns') arranged in a row or column direction (in FIG. 29, a plurality of columns of contact parts arranged in a column direction). Due to this, the plurality of first metal films 147 extend almost in parallel in a predetermined direction, e.g., in a row direction, parts of each of the first metal films 147 are in contact with the plurality of point contacts 145, and the other parts are in contact with parts of the anti-reflection layer 130. The plurality of first metal films 147 of this type transfers the charges collected by the plurality of point contacts 145 to the plurality of second metal films 149.

As previously explained, the distance between neighboring point contacts 145 is determined in consideration of the movement distance of charges, and hence charge movement is enabled not only through the plurality of first metal films 147 but also between the neighboring point contacts 145.

As shown in FIG. 31, the width D1 of each first metal film 147 is designed to be larger than the width D0 of the point contacts 145, thereby improving the charge transfer capability.

However, it is preferred, though not required, that the width D1 of each first metal film 147 is rather small in consideration of light receiving area, light reflectance, or light absorbance. In one example, the width D1 of each first metal film 147 may range from about 50 μm to 80 μm, which is equal to the width D0 of the point contacts 145 in consideration of the particle characteristics of conductive paste used to manufacture the first metal films 147, for example, paste containing silver (Ag), light receiving area, contact resistance with a contacting portion, and self resistance. This provides the effect of an increase in the light receiving area.

Also, the distance W1 between neighboring first metal films 147 may be equal to the distance Wc between the point contacts 145 adjacent in a column direction.

The plurality of second metal films 149 are positioned on the plurality of contact point columns or the plurality of contact point rows, and thus extends in a predetermined direction (in FIG. 29, a column direction) almost in parallel to a direction crossing the plurality of first metal films 147. At this point, each second metal film 149 extends from parts of the plurality of first metal films 147 in a direction crossing the plurality of first metal films 147. Thus, the contact point columns are positioned at crossings between the plurality of first metal films 147 and each second metal film 149, i.e., at branching portions. Due to this, the plurality of second metal films 149 outputs, to the outside, not only the charges moving through the plurality of first metal films 147 but also the charges transferred from the plurality of point contacts 145 positioned right thereunder, thereby improving transfer efficiency.

The width D2 of the second metal films 149 is designed to be larger than the width D1 of the first metal films 147 so as to facilitate the movement of charges to an external device, but the embodiment is not limited thereto.

The plurality of first and second metal films 147 and 149 are formed of the same material, and formed of a conductive material containing silver (Ag). In an alternative example, the plurality of first metal films 147 and the plurality of second metal films 149 may contain, instead of silver (Ag), at least one selected from the group consisting of nickel (Ni), copper (Cu), aluminum (Al), tin (Sn), zinc (Zn), indium (In), titanium (Ti), gold (Au), and a combination thereof, or otherwise may contain other conductive materials.

In the alternative example, the plurality of first and second metal films 147 and 149 may be made of a transparent conductive material. Examples of the transparent conductive material may include at least one selected from the group consisting of ITO (indium tin oxide), tin-based oxide, zinc-based oxide, and a combination thereof.

In this case, there is no risk that the light receiving area will be reduced by the first and second metal films 147 and 149, and therefore the widths D1 and D2 of the first and second metal films 147 and 149 may be Ruined to be larger than the width D0 of the point contacts 145.

In this manner, when the plurality of first and second metal films 147 and 149 are made of a transparent conductive material, the incident area of light can be increased to thus improve the efficiency of the solar cell 1a, and the widths D1 and D2 of the first and second metal films 147 and 149 can be increased to thus increase the transfer efficiency of charges through the first and second metal films 147 and 149 and further improve the efficiency of the solar cell 1a.

In the solar cell 1a having such a structure of the first charge transfer unit 140a, the plurality of second collector regions 152 of the second charge transfer unit 150 may have various structures shown in FIGS. 17 to 27, as well as the structure shown in FIG. 3. The second collector regions 152 of this structure have been already described with reference to FIGS. 17 to 27, so a detailed description thereof will be omitted.

Next, a method for manufacturing a solar cell 1a according to another example embodiment of the present invention will be described with reference to FIGS. 32 to 39.

FIGS. 32 to 39 are cross-sectional views sequentially showing a method for manufacturing a solar cell according to another example embodiment of the present invention.

First, the surface of a substrate 110 made of type monocrystalline or polycrystalline silicon, which is corrugated, is textured to form a textured surface. At this time, in case the substrate 110 is made of monocrystalline silicon, the surface of the substrate 110 is textured by using a basic solution, such as KOH, NaOH, or TMAH (tetramethylammonnium hydroxide). In case the substrate 110 is made of polycrystalline silicon, the surface of the substrate 110 is textured by using an acid solution, such as HF or $HNO_3$.

Figure 33:
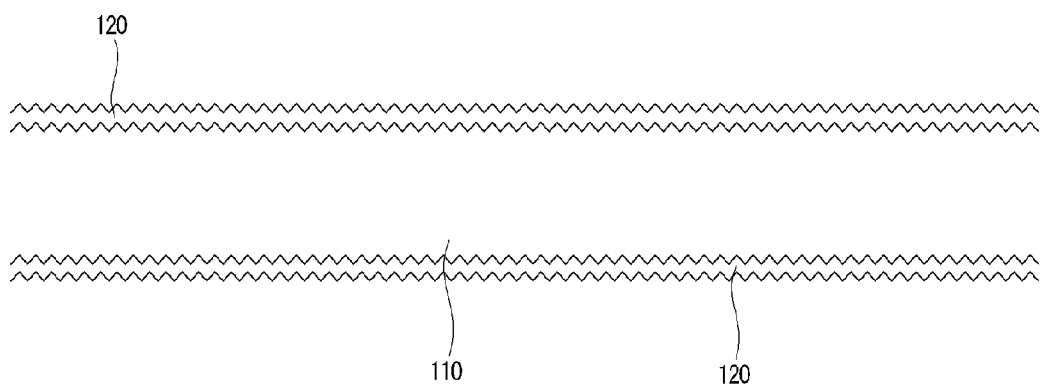

Next, as shown in FIG. 33, a material, for example, $POCL_3$ or $H_3PO_4$, containing an impurity of a group V element, such as phosphor (P), arsenic (As), and antimony (Sb), is thermally treated at a high temperature to diffuse the impurity of the group V element on the substrate 110, thereby forming an emitter layer 120 on the entire surface, i.e., front, rear, and side surfaces, of the substrate 110. Unlike this example embodiment, in case the conductive type of the substrate 110 is an n type, a material, for example, $B_2H_6$, containing an impurity of a group III element may be thermally treated at a high temperature or stacked to thus form a p-type emitter region on the entire surface of the substrate 110. Next, an oxide (phosphorous silicate glass, PSG) containing phosphor or an oxide (boron silicate glass, BCG) containing boron, which is produced by the diffusion of a p-type impurity or an n-type impurity into the substrate 110, is removed by an etching process.

Figure 34:
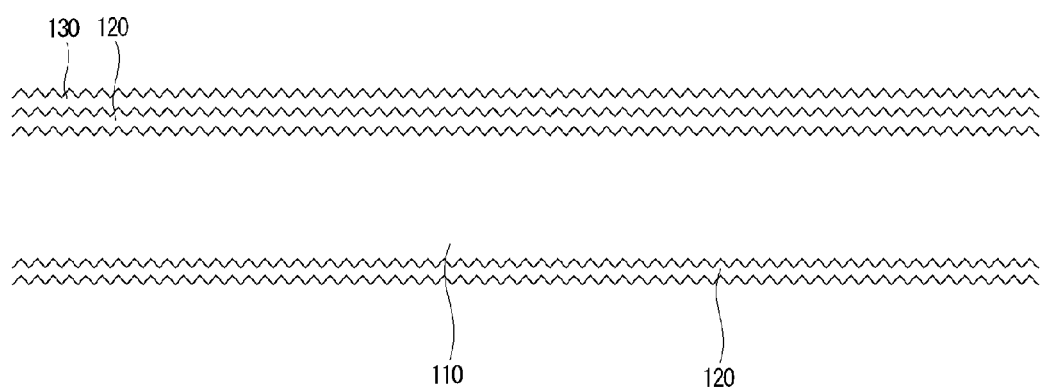

Next, referring to FIG. 34, an anti-reflection layer 130 is formed on the incident surface of the substrate 110 by a chemical vapor deposition (CVD) method, such as plasma enhanced chemical vapor deposition (PECVD).

As shown in FIG. 35, a paste containing silver (Ag) is printed on a corresponding portion of the rear surface of the substrate 110 using a screen printing method and then dried at about 120□ to about 200□ to form a plurality of second collector region patterns 1521 having a stripe shape, and a paste containing aluminum (Al) is printed substantially on the remaining portion of the rear surface of the substrate 110 using a screen printing method and then dried to form a second electrode pattern 1511 (FIG. 36). At this point, the second electrode pattern 1511 partially overlaps with a plurality of neighboring collector region patterns 1521, but the embodiment is not limited thereto.

Figure 37:
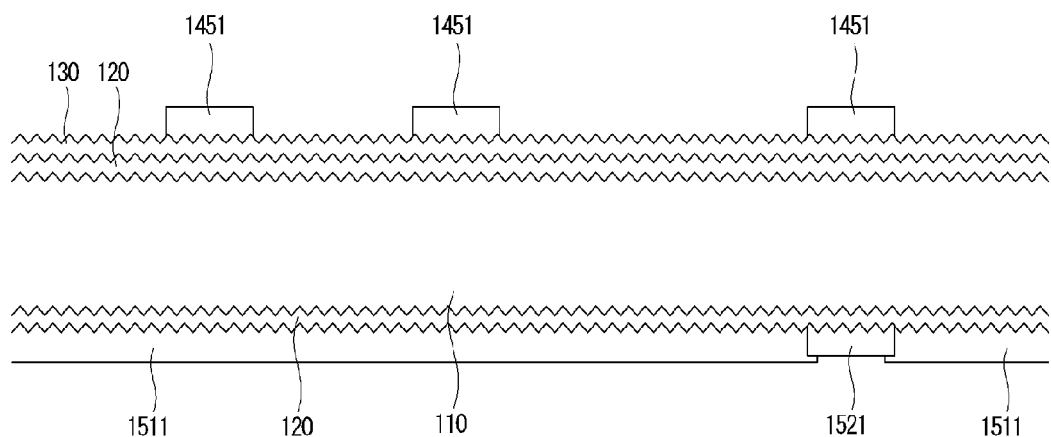

Next, as shown in FIG. 37, a paste containing silver (Ag) is printed on a corresponding portion of the front surface of the substrate 110 using a screen printing method and then dried to form a plurality of point contact patterns 1451.

The order of formation of these patterns 1521, 1511, and 1451 may be varied.

Figure 38:
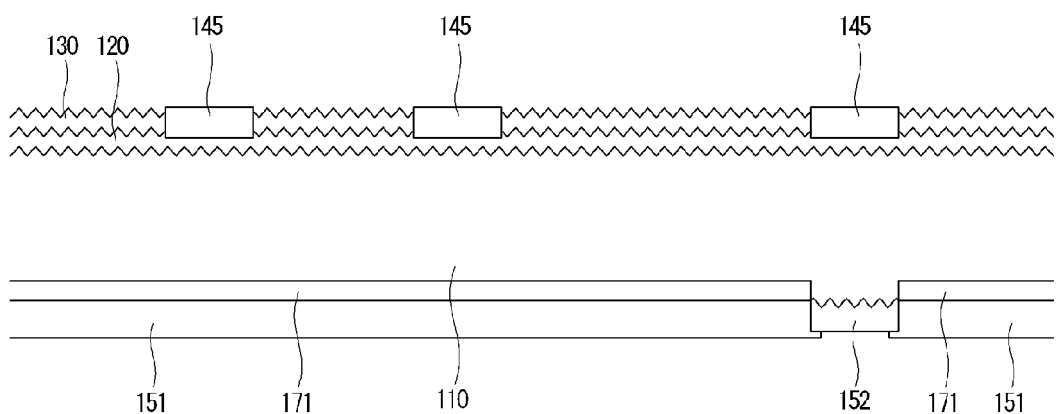

Next, the substrate 110 provided with the plurality of second collector region patterns 1521, the second electrode pattern 1511, and the plurality of point contact patterns 1451 are fired at a temperature of about 750° C. to about 800° C. to form a plurality of point contacts 145 electrically and physically contacting a plurality of second collector regions 152, a second electrode 151, and an emitter layer 120, and to form a back surface field 171 between the substrate 110 and the second electrode 151 (FIG. 38).

That is, when a thermal treatment is carried out, as glass frits contained in the point contact patterns 1451 and containing lead (Pb) are melted, the anti-reflection layer 130 at a contacting portion is etched. Thus, silver (Ag) and the like contained in the point contact patterns 1451 is brought into contact with the emitter layer 120, thereby forming the plurality of point contacts 145 physically and electrically connected to the emitter layer 120. Also, in the thermal treatment process, aluminum (Al) contained in the second electrode 151 is diffused toward the substrate 110 contacting the second electrode 151, thereby forming the back surface field 171 between the second electrode 151 and the substrate 110. At this time, the back surface field 171 is a p conductive type, which is the same conductive type as the substrate 110. More specifically, the back surface field 171 is a p+ conductive type because the concentration of an impurity of the back surface field 171 is higher than that of the substrate 110.

Figure 39:
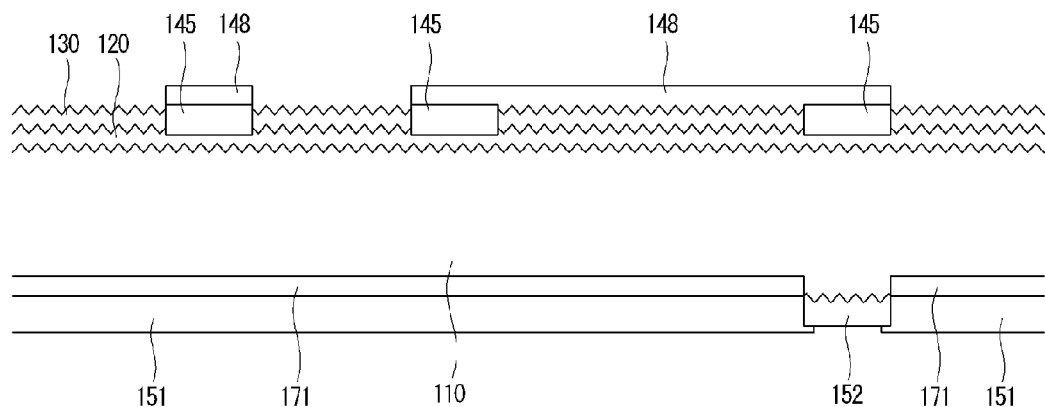

Next, as shown in FIG. 39, a conductive paste containing silver (Ag) is printed on a corresponding portion of the incident surface of the substrate 110 using a screen printing method to form first and second metal film patterns 148. Then, they are dried to form first and second metal films 147 and 149, thereby completing the solar cell 1a. In an alternative example, the conductive paste for forming the first and second metal film patterns 148 may contain a transparent conductive material.

As above, the first and second metal films 147 and 149 are formed by performing a drying process without a firing process. Hence, the spread of the first and second metal film patterns 148 does not occur. Accordingly, the light receiving area is increased due to a reduction of the formation area of the first and second metal films 147 and 149, thereby improving the efficiency of the solar cell 1a.

In addition, in the alternative example, parts of the anti-reflection layer 130 are removed by an etching method or the like to expose parts of the emitter layer 120, a plurality of point contacts 145 are positioned on the exposed parts of the emitter layer 120, and then first and second metal films 147 and 149 are formed thereon by various film formation methods, such as screen printing method or a sputtering method. In this case, the plurality of point contacts 145 does not have to penetrate the anti-reflection layer 130, and therefore lead or the like does not need to be contained therein. Hence, there is no need to worry about environmental contamination, and the contact force between the emitter layer 120 and the plurality of point contacts 145 is improved.

Figure 41:
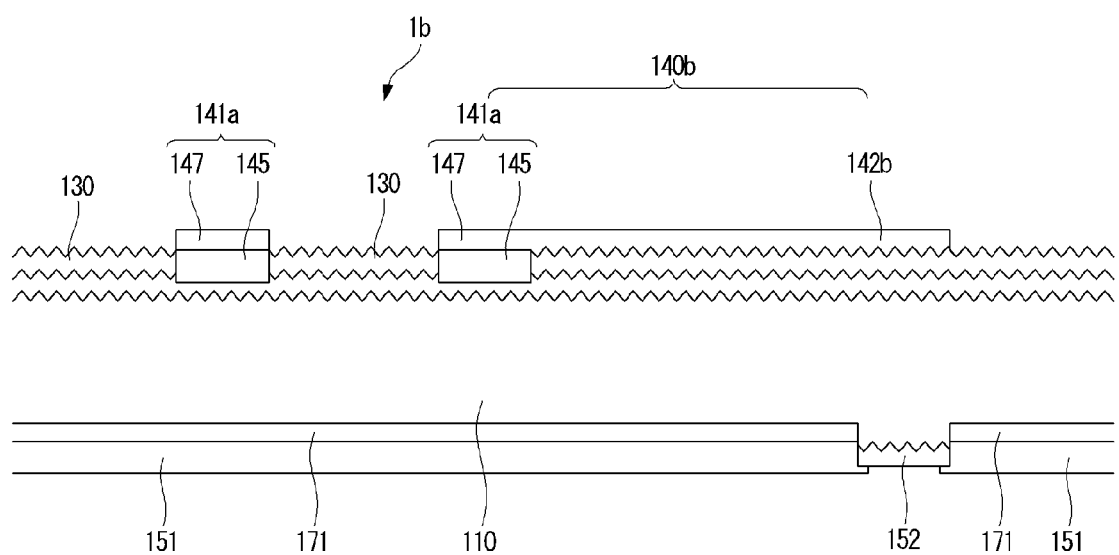
FIG. 41 is a cross-sectional view taken along line XXXXI-XXXXI of FIG. 40.
Figure 42:
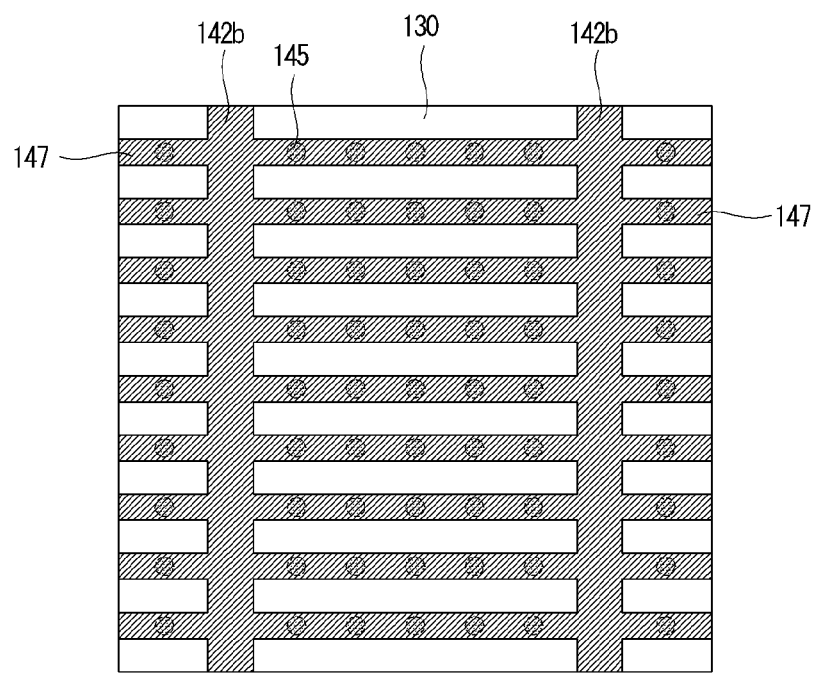
FIG. 42 is a view showing a state where a plurality of first and second metal films is formed on a plurality of point contacts in a solar cell according to another example embodiment of the present invention.

Another example of the solar cell according to another example embodiment of the present invention will be described with reference to FIGS. 40 to 42.

Figure 40:
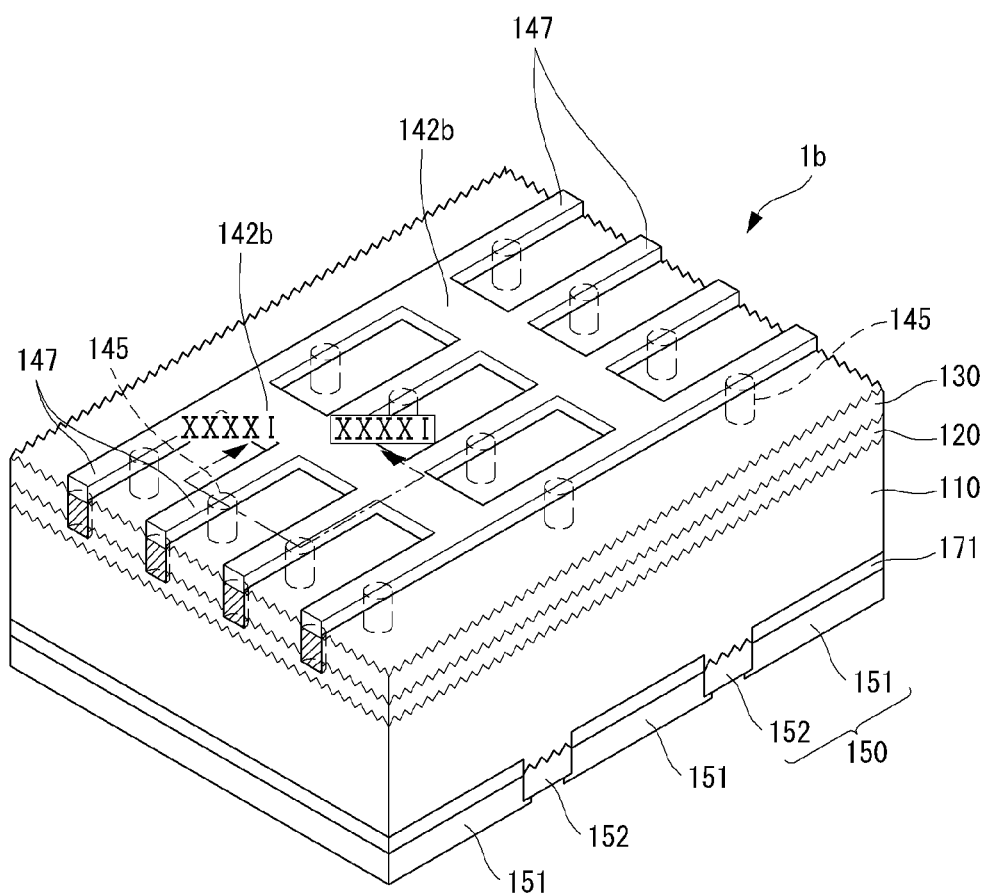
FIG. 40 is a partial perspective view of a solar cell according to another example embodiment of the present invention.

FIG. 40 is a partial perspective view of a solar cell according to another example embodiment of the present invention. FIG. 41 is a cross-sectional view taken along line XXXXI-XXXXI of FIG. 40. FIG. 42 is a view showing a state where a plurality of first and second metal films is formed on a plurality of point contacts in a solar cell according to another example embodiment of the present invention.

A solar cell 1b according to this example has the same structure as the solar cell 1a shown in FIGS. 28 and 29 except the structure of a first charge transfer region 140b. Accordingly, components having the same structure and performing the same functions are designated with the same reference numerals, and a detailed description thereof is omitted.

The first charge transfer region 1b according to this example has a plurality of point contacts 145, a plurality of metal films 147, and a plurality of collector regions 142b.

Unlike FIGS. 28 and 29, the plurality of point contacts 145 are positioned mainly under the plurality of metal films 147, and does not exist under the plurality of collector regions 142b. Since the number of formation of the plurality of point contacts 145 is reduced, manufacturing costs can be cut down.

In this example, a plurality of collector regions 142b are connected to the plurality of metal films 147, while in an alternative example, the plurality of collector regions 142b may be separated from the plurality of metal films 147.

A method for manufacturing such a solar cell 1a is identical to that described with reference to FIGS. 32 to 39, so a description thereof will be omitted.

Although such a solar cell 1, 1a, and 1b may be independently used, the plurality of solar cells 1, 1a, and/or 1b may be connected for more efficient use to form a solar cell module.

Figure 44:
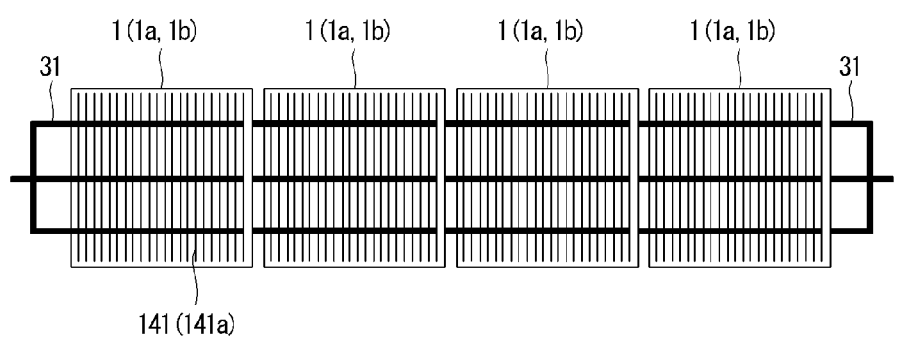
FIG. 44 is a plane view showing a connection state between solar cells according to one example embodiment of the present invention.
Figure 45:
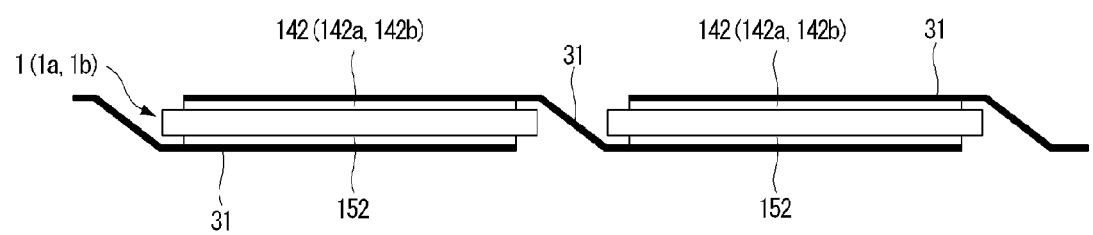
FIG. 45 is a cross-sectional view showing the connection state between the solar cells according to one example embodiment of the present invention.

Next, a solar cell module using the solar cells 1, 1a, and/or 1b according to the example embodiments of the present invention will be described with reference to FIGS. 43 to 45.

Figure 43:
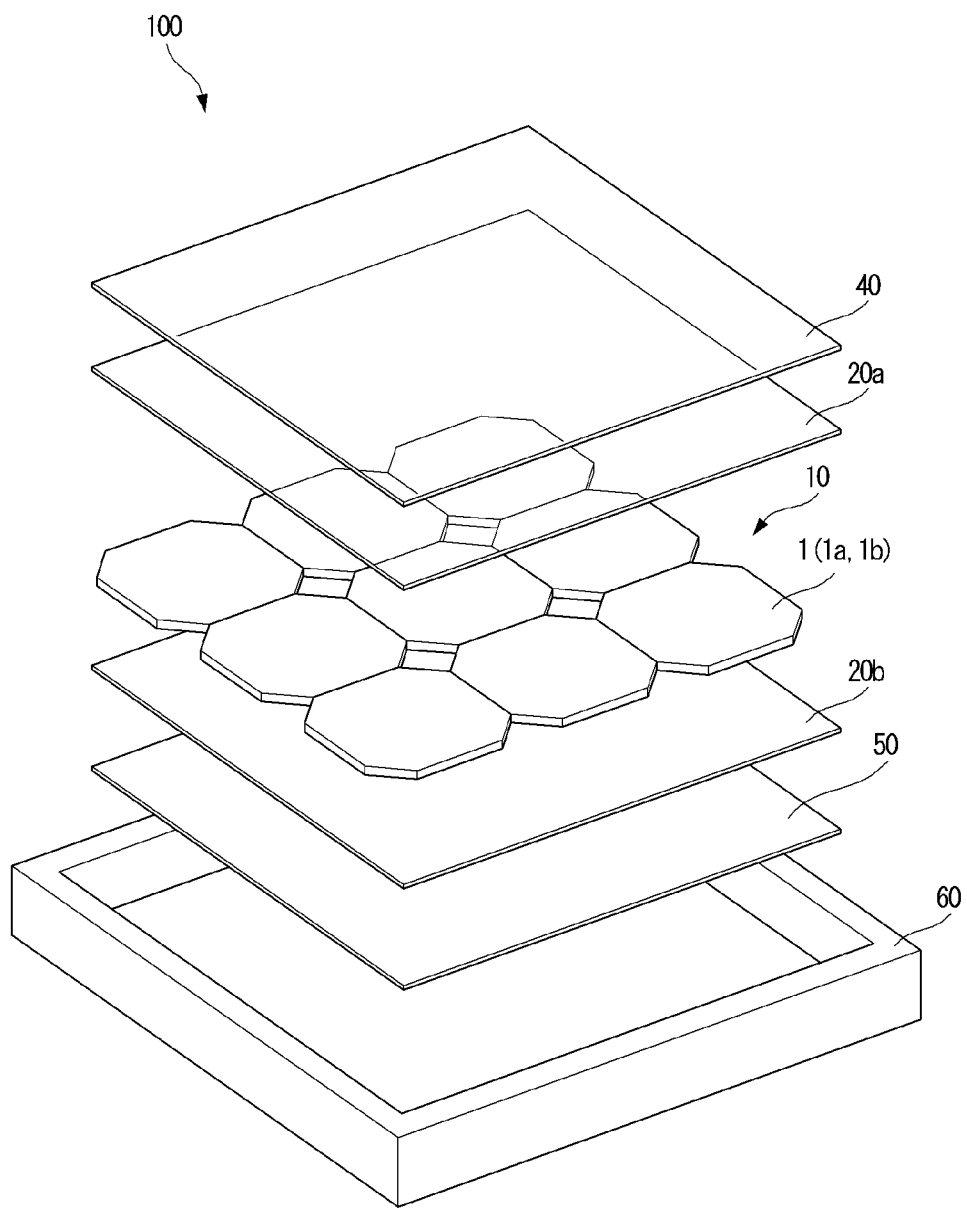
FIG. 43 is a schematic view showing a solar cell module according to one example embodiment of the present invention.

FIG. 43 is a schematic view showing a solar cell module according to an example embodiment of the present invention. FIG. 44 is a plane view showing a connection state between solar cells according to an example embodiment of the present invention. FIG. 45 is a cross-sectional view showing the connection state between the solar cells according to an example embodiment of the present invention.

Referring to FIG. 43, the solar cell module 100 according to this example embodiment includes a solar cell array 10, protection films 20a and 20b for protecting the solar cell array 10, a transparent member 40 positioned on the protection film (hereinafter, 'an upper protection film') 20a positioned on the light receiving surface of the solar cell array 10, a back sheet 50 disposed under the protection film (hereinafter, 'a lower protection film') 20b positioned on the opposite side of the light receiving surface on which light is not incident, and a frame 60 housing these components.

The solar cell array 10 has a plurality of solar cells 1, 1a, and/or 1b arranged in a matrix structure. In FIG. 43, the solar cell array 10 has a 3×3 matrix structure, but the embodiment is not limited thereto and the number of solar cells 1, 1a, and/or 1b disposed in respective row and column directions may be adjusted if required.

The solar cells 1, 1a, and/or 1b are electrically connected in series or in parallel to neighboring solar cells 1, 1a, and/or 1b. At this point, as shown in FIGS. 44 and 45, electrical connection between first collector regions 142, 142a, and 142b respectively positioned at the neighboring solar cells 1, 1a, and/or 1b and second collector regions 152 is carried out by using a conductive connecting region 31. That is, the conductive connecting region 31 is positioned and then fixed onto the first collector regions 142, 142a, and 142b, positioned at different solar cells 1, 1a, and/or 1b, and the second collector regions 152, thereby performing electrical connection between the two collector regions 142 (or 142a or 142b) and 152. At this point, the conductive connecting region 31 may be a conductive tape, which is a thin metal tape called a ribbon, that has a conductive material and having a string shape. In order to increase the adhesion efficiency between the conductive connecting region 31 and each of the collector regions 142 (or 142a or 142b) and 152, an adhesive may be applied on the collector regions 142 (or 142a or 142b) and then the conductive connecting region 31 may be attached thereto or a laser beam may be irradiated thereto.

The back sheet 50 prevents moisture from permeating the back surface of the solar cell module 100 and hence protects the solar cells 1, 1a, and/or 1b from an outside environment. The back sheet 50 of this type may have a multilayered structure, such as a layer for preventing permeation of moisture and oxygen, a layer for preventing chemical corrosion, and a layer having insulation characteristics.

The upper and lower protection films 20a and 20b prevent the corrosion of metals caused by moisture permeation and protect the solar cell module 100 from an impact. The upper and lower protection films 20a and 20b of this type are integrated with the solar cell array 10 during a lamination process, being disposed on the upper and lower portions of the solar cell array 10. These protection films 20a and 20b may be made of ethylene vinyl acetate (EVA), polyvinyl butyral, ethylene vinyl acetate partial oxide, a silicon resin, an ester-based resin, an olefin-based resin, and the like.

The transparent member 40 positioned on the upper protection film 20a is made of tempered glass having high transmittance and excellent damage prevention function. At this point, the tempered glass may be a low iron tempered glass having a low iron content. The inner surface of the transparent member 40 may be embossed in order to increase light scattering effect.

The frame 60 is made of a material, such as aluminum, which is coated with an insulating material and does not undergo corrosion, deformation, or the like due to an outside environment, and has a structure which makes drainage, installation, and construction easier.

Even though the present invention is described in detail with reference to the foregoing embodiments, it is not intended to limit the scope of the present invention thereto. It is evident from the foregoing that many variations and modifications may be made by a person having ordinary skill in the present field without departing from the essential concept and scope of the present invention as defined in the appended claims.

What is claimed is:
1. A solar cell comprising:
   a substrate of a first conductive type;
   an emitter layer of a second conductive type opposite the first conductive type, and positioned on the substrate;

a plurality of finger electrodes formed in a first direction, each finger electrode being electrically connected to the emitter layer;

a plurality of first collector regions formed in a second direction crossing, the first direction, wherein the plurality of first collector regions include a plurality of first electrodes extending in the first direction from the plurality of finger electrodes and having a space of a predetermined distance from each other positioned in parallel in the second direction, and a plurality of second electrodes positioned between the space of the plurality of first electrodes in the second direction and two neighboring second electrodes of the plurality of second electrodes positioned in a different space in the plurality of first collector regions; and a plurality of deletions positioned in the plurality of first collector regions, wherein one of the plurality of deletions is positioned in an area of one first collector region of the plurality of first collector regions formed only by a pair of first electrodes of the plurality of first electrodes, and one second electrode of the plurality of second electrodes.

2. The solar cell of claim 1, wherein one electrode of the pair of first electrodes is positioned at an upper end of the one deletion and the other electrode of the pair of first electrodes is positioned at a lower end of the one deletion opposite the upper end of the one deletion.

3. The solar cell of claim 2, wherein the one second electrode is positioned at a left end of the one deletion or at a right end of the one deletion opposite the left end of the one deletion.

4. The solar cell of claim 3, wherein opposite ends of the one second electrode are connected to the pair of first electrodes, respectively.

5. The solar cell of claim 1, wherein the pair of first electrodes and the one second electrode form a first collector, and wherein the first collector connected to the pair of first electrodes and the one second electrode has a ㄷ-shape.

6. The solar cell of claim 5, wherein the plurality of deletions are rectangular.

7. The solar cell of claim 1, wherein one of the plurality of second electrodes are disposed in a first vertical line along a perpendicular direction crossing the first direction, other of the plurality of second electrodes are disposed in a second vertical line along the perpendicular direction crossing the first direction, and the first vertical line and the second vertical line are different vertical lines positioned non-collinearly along the perpendicular direction crossing the first direction.

8. The solar cell of claim 1, further comprising:

a back electrode electrically connected to the substrate; and at least one second collector region connected to the back electrode.

9. The solar cell of claim 8, wherein an area formed by linearly connecting in a perpendicular direction both lateral sides of at least one of the at least one second collector region comprises at least one deletion, and wherein the at least one deletion is positioned in a portion of the at least one second collector region lacking an electrode.

10. The solar cell of claim 1, wherein the pair of first electrodes and the one second electrode form a second collector, and wherein the second collector is connected to the pair of first electrodes and the one second electrode.

11. The solar cell of claim 10, wherein the plurality of deletions are rectangular.

* * * * *